(12) United States Patent
Li et al.

(10) Patent No.: US 11,557,346 B2
(45) Date of Patent: Jan. 17, 2023

(54) SELF-ADAPTIVE PROGRAM PULSE WIDTH FOR PROGRAMMING 3D NAND MEMORY

(71) Applicant: Western Digital Technologies, Inc., San Jose, CA (US)

(72) Inventors: Liang Li, Shanghai (CN); Ming Wang, Shanghai (CN); Xuan Tian, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/336,314

(22) Filed: Jun. 2, 2021

(65) Prior Publication Data
US 2022/0392534 A1 Dec. 8, 2022

(51) Int. Cl.
| | |
|---|---|
| *G11C 16/04* | (2006.01) |
| *G11C 16/10* | (2006.01) |
| *G11C 16/34* | (2006.01) |
| *H01L 27/11582* | (2017.01) |

(52) U.S. Cl.
CPC .......... *G11C 16/10* (2013.01); *G11C 16/0483* (2013.01); *G11C 16/3459* (2013.01); *H01L 27/11582* (2013.01)

(58) Field of Classification Search
CPC .. G11C 16/10; G11C 16/0483; G11C 16/3459
USPC ...................................... 365/185.17
See application file for complete search history.

(56) References Cited

U.S. PATENT DOCUMENTS

| | | | | |
|---|---|---|---|---|
| 6,490,201 | B2 * | 12/2002 | Sakamoto | G11C 16/3459 365/185.03 |
| 7,092,290 | B2 | 8/2006 | Hemink | |
| 7,630,249 | B2 | 12/2009 | Fong et al. | |
| 9,324,419 | B2 * | 4/2016 | Pang | H01L 27/1157 |
| 9,437,318 | B2 | 9/2016 | Dong et al. | |
| 9,548,124 | B1 | 1/2017 | Hazeghi et al. | |
| 10,614,898 | B1 | 4/2020 | Yang et al. | |
| 10,754,583 | B2 | 8/2020 | Liikanen | |
| 2010/0195387 | A1 * | 8/2010 | Park | G11C 11/5628 365/185.03 |

(Continued)

OTHER PUBLICATIONS

U.S. Appl. No. 17/231,344, filed Apr. 15, 2021.

(Continued)

*Primary Examiner* — Tha-O H Bui
(74) *Attorney, Agent, or Firm* — Vierra Magen Marcus LLP

(57) ABSTRACT

Apparatuses and techniques are described for detecting and compensating for a set of memory cells having a slow program speed, based on a comparison between the number of program loops used to complete programming for different data states. A program loop (PL) number is stored when programming is completed for memory cells of each assigned data state. The PL number of an nth state is then compared to the PL number of another state such as the n−1st state. If the difference between the PL numbers exceeds a threshold, the set of memory cells is considered to be slow programming and a compensation is triggered. The compensation can involve increasing the program pulse width in each remaining program pulse of the program operation. In another approach, the compensation can be triggered and subsequently deactivated in the program operation.

20 Claims, 21 Drawing Sheets

(56) References Cited

U.S. PATENT DOCUMENTS

2016/0019947 A1  1/2016  Pang et al.

OTHER PUBLICATIONS

International Search Report & the Written Opinion of the International Searching Authority dated May 4, 2022, International Application No. PCT/US2022/012213.

* cited by examiner

Fig. 1A
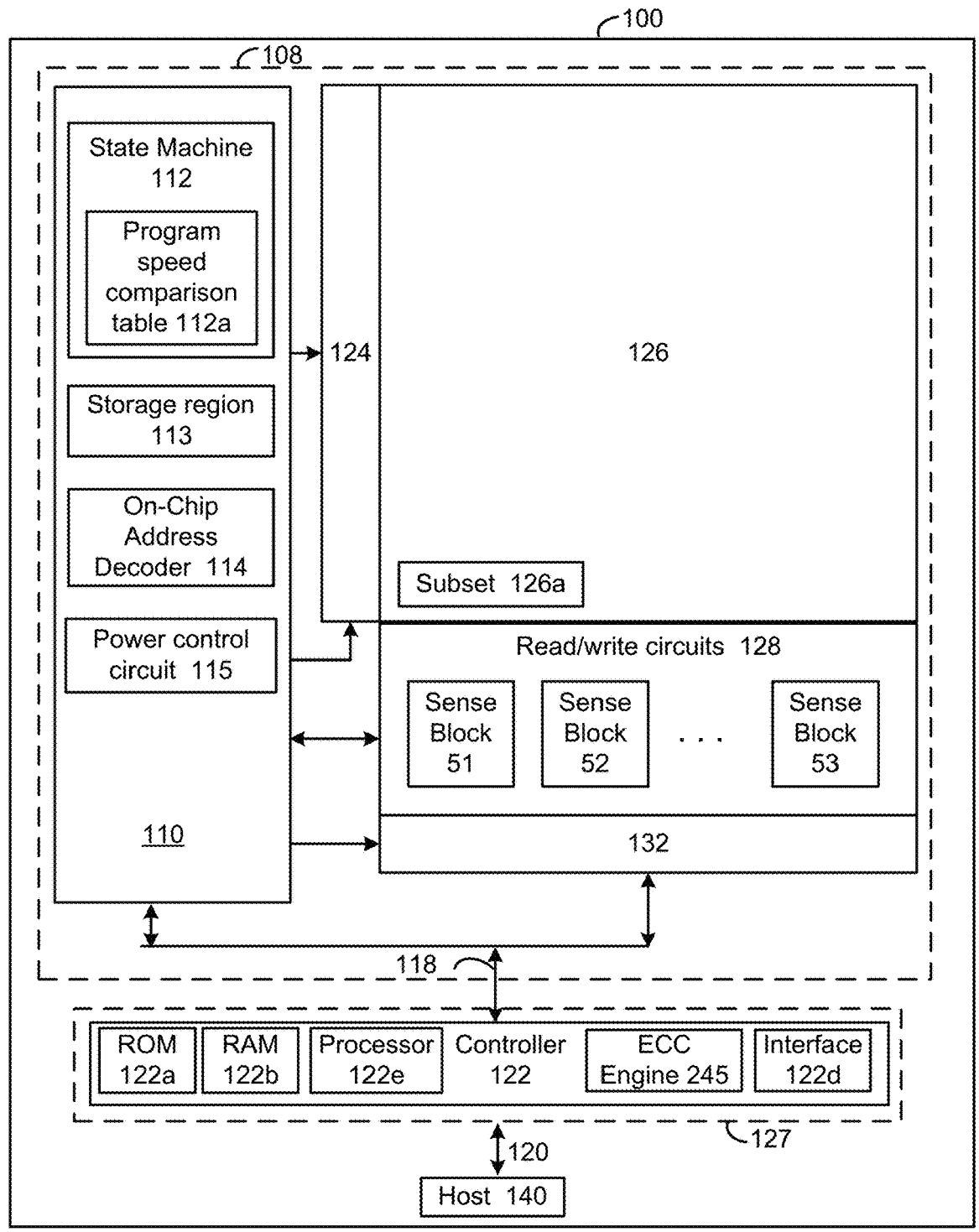
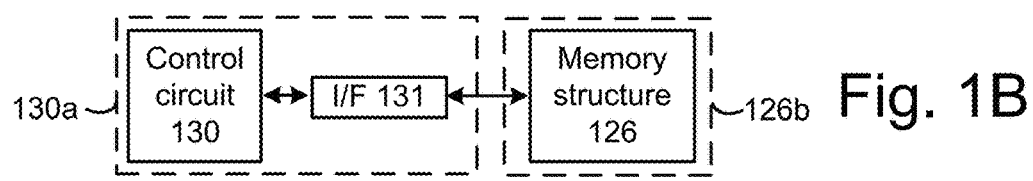
Fig. 1B

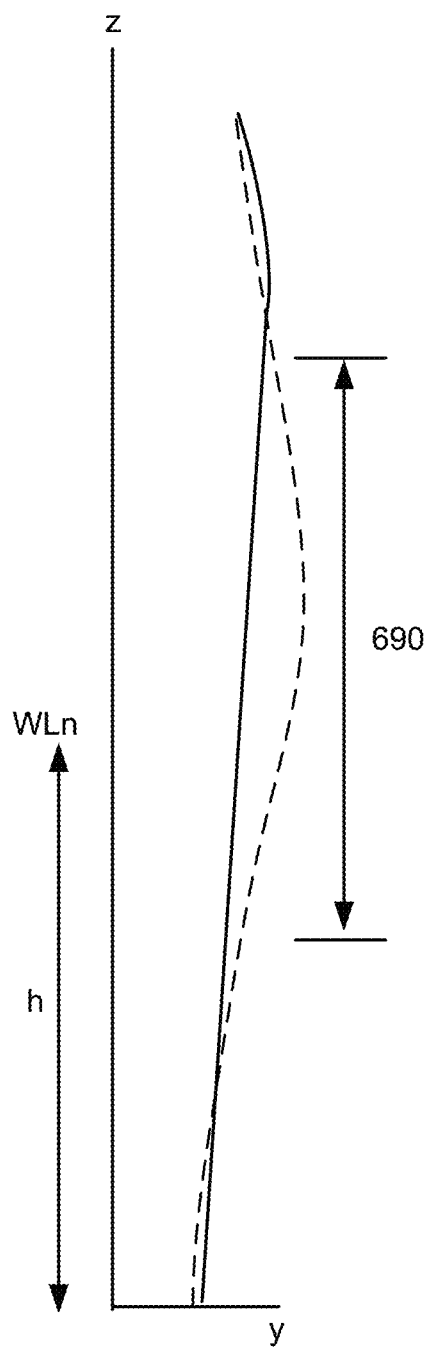
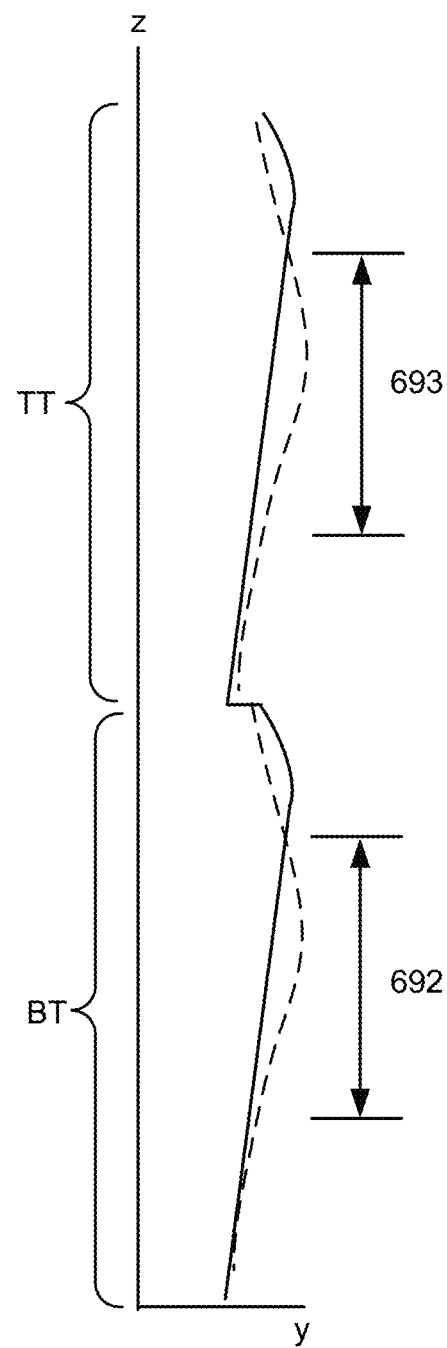

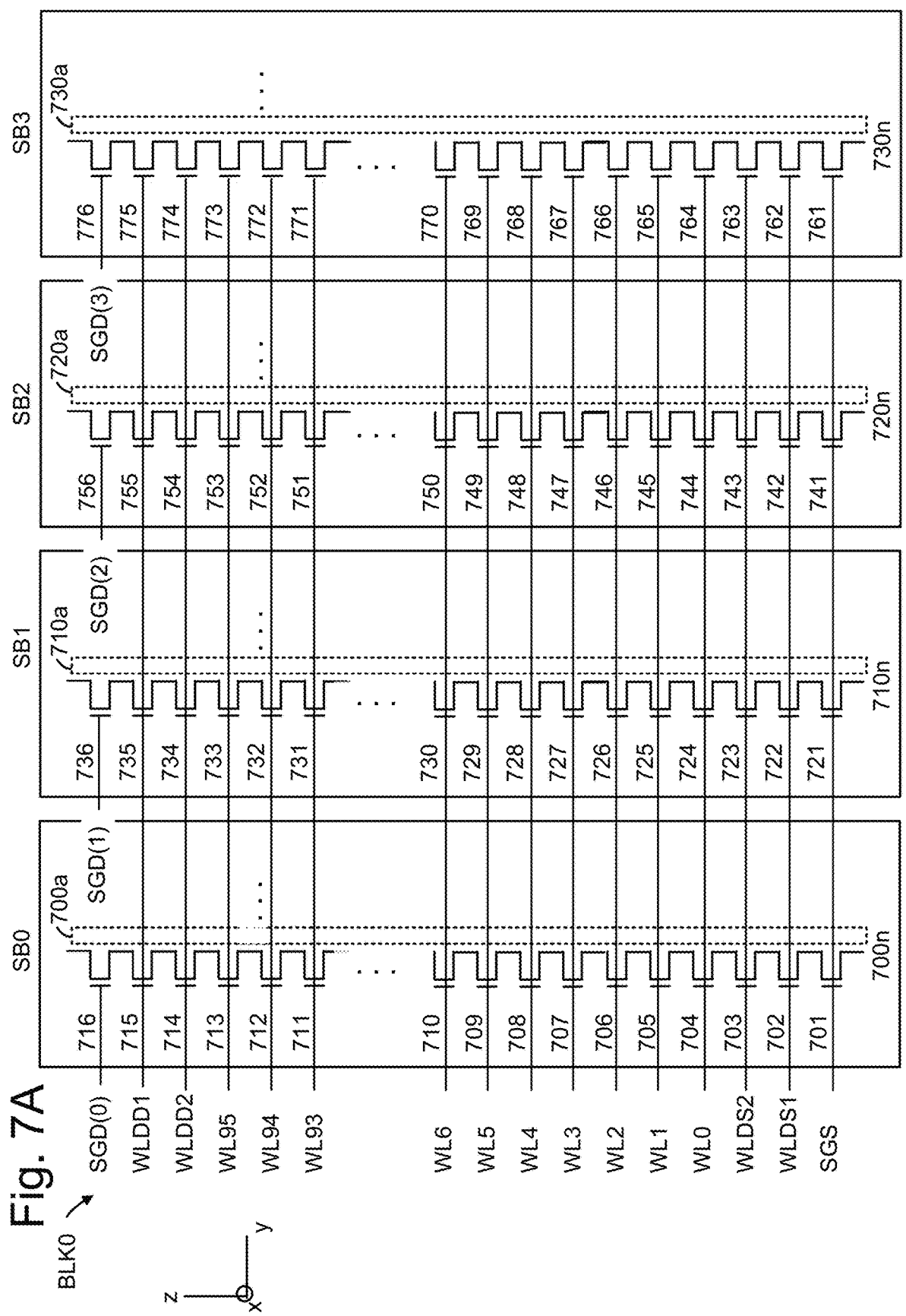

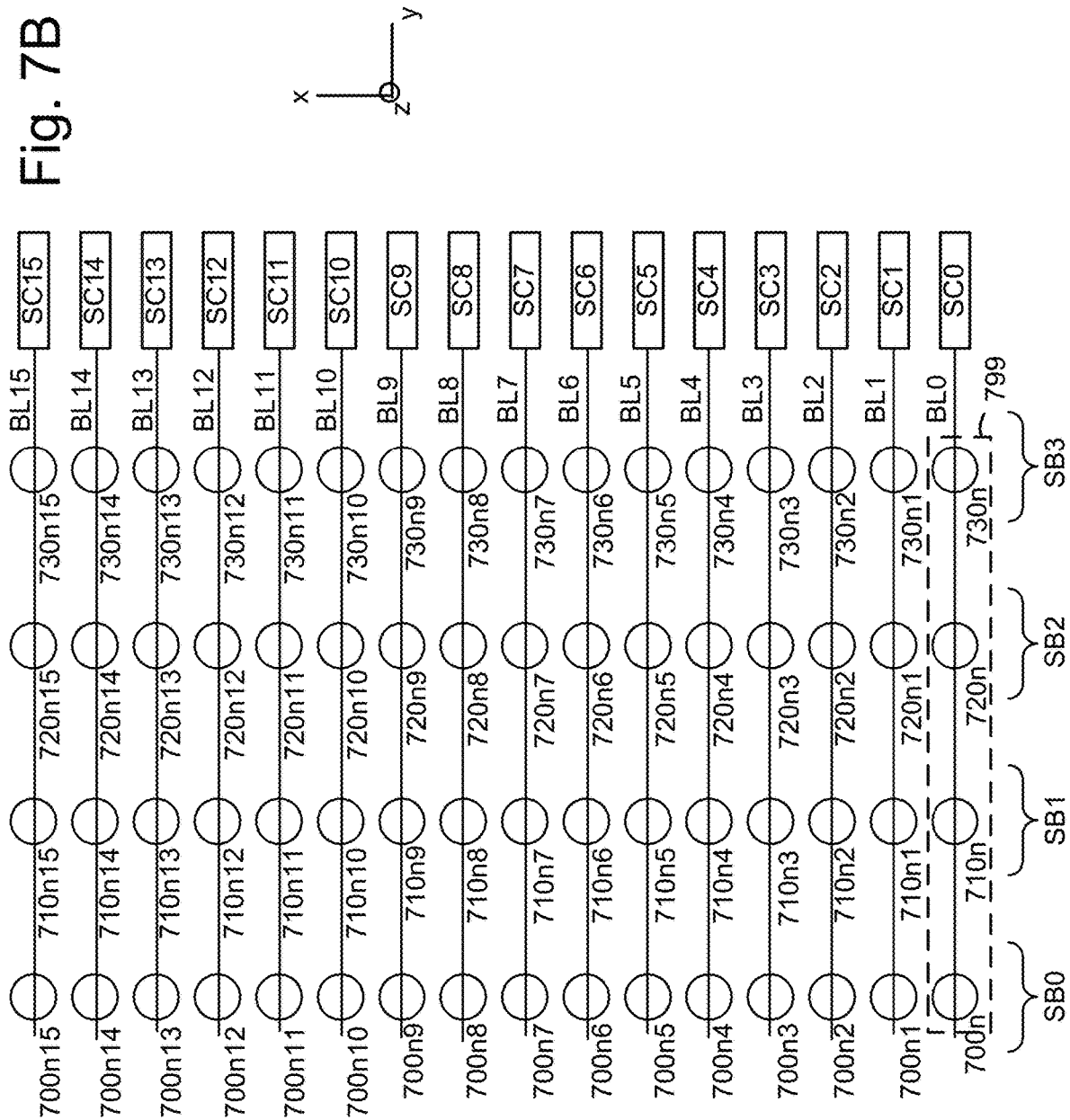

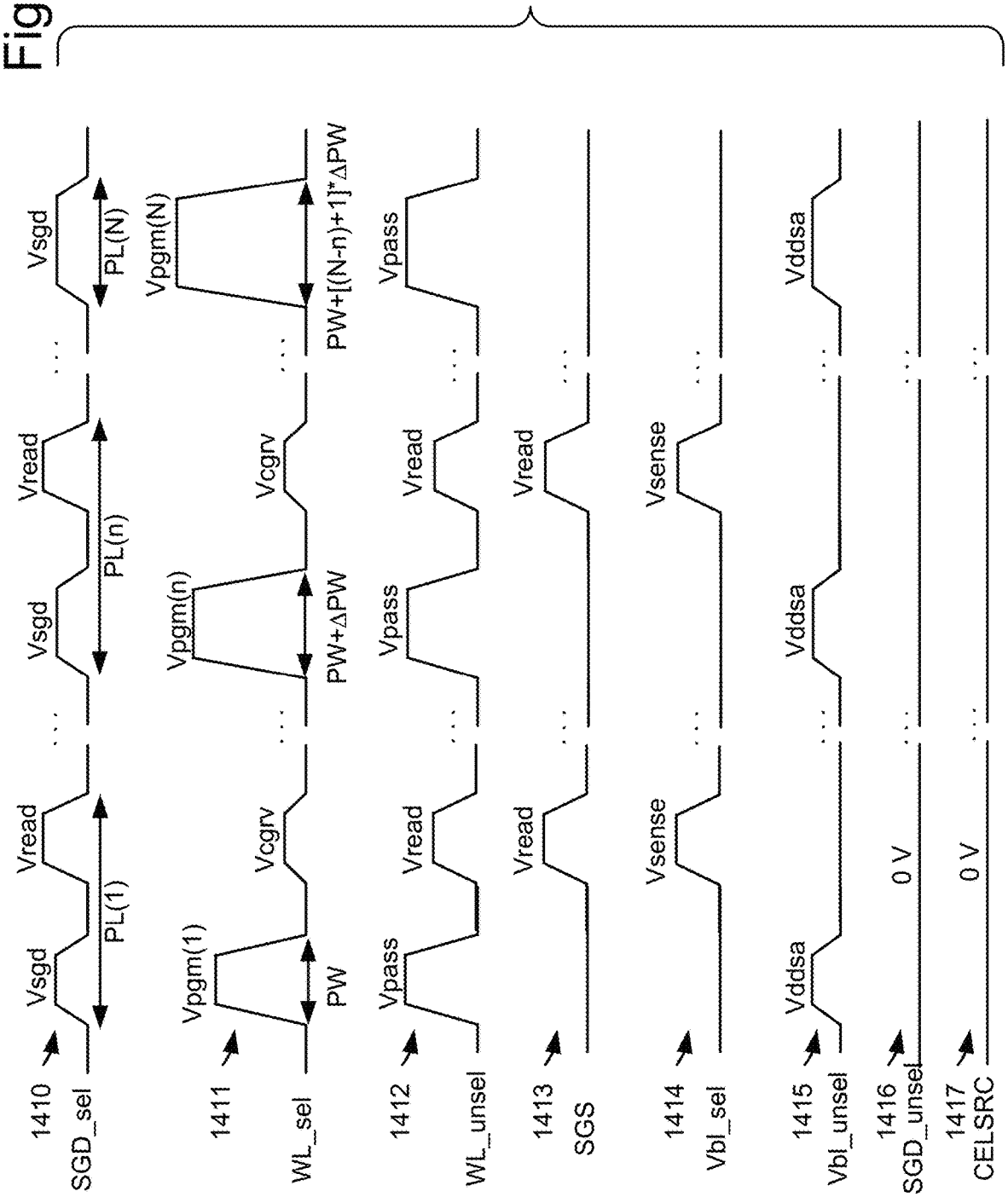

| State | PL completion | $\Delta PL = (PL(state(n)) - PL(state(n-1)))$ | Th=3 $\Delta PL > Th$ |
|---|---|---|---|
| A | 5 | --- | --- |
| B | 6 | 1 | no |
| C | 10 | 4 | yes |
| D | 12 | --- | --- |
| E | 14 | --- | --- |
| F | 17 | --- | --- |
| G | 20 | --- | --- |

Fig. 14D

| State | PL completion | $\Delta PL = (PL(state(n)) - PL(state(n-2)))$ | Th=5 $\Delta PL > Th$ |
|---|---|---|---|
| A | 5 | --- | --- |
| B | 6 | --- | --- |
| C | 10 | 5 | no |
| D | 12 | 6 | yes |
| E | 14 | --- | --- |
| F | 17 | --- | --- |
| G | 20 | --- | --- |

Fig. 14E

| State | PL completion | ΔPL=PL(state(n))-PL(state(n-1)) | Th=3 ΔPL>Th |
|---|---|---|---|
| A | 5 | -- | -- |
| B | 6 | 1 | no |
| C | 10 | 4 | yes |
| D | 14 | 4 | yes |
| E | 16 | 2 | no |
| F | 17 | 1 | no |
| G | 20 | -- | -- |
Fig. 16D
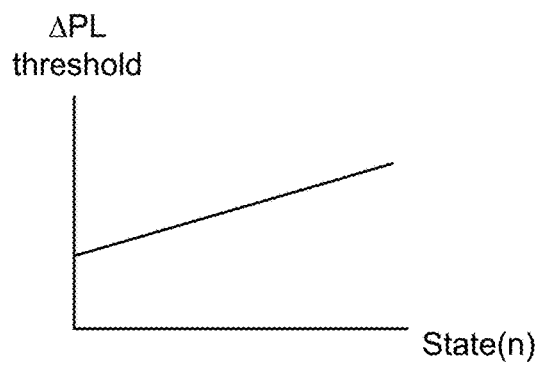
Fig. 17A
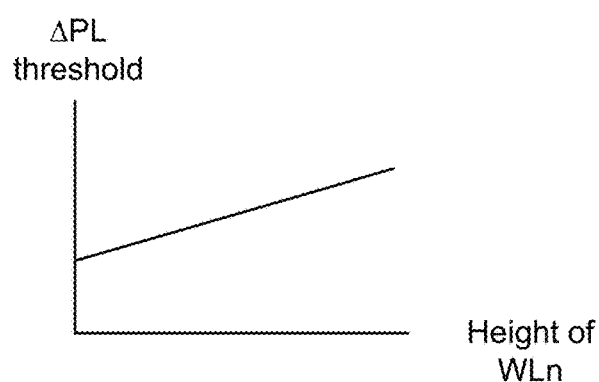
Fig. 17B
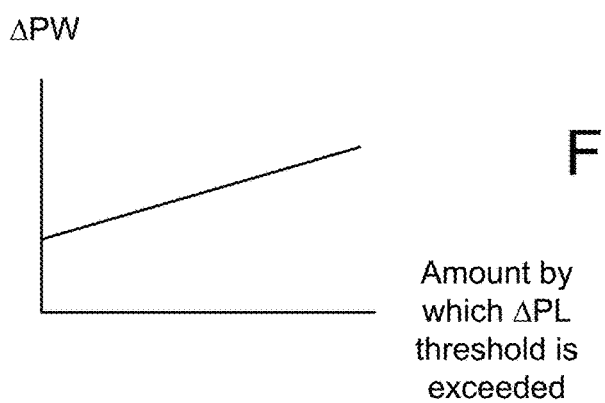
Fig. 17C

SELF-ADAPTIVE PROGRAM PULSE WIDTH FOR PROGRAMMING 3D NAND MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 6C depicts example plots of memory hole width versus height in the NAND string 700n of FIG. 6A.

FIG. 6D depicts example plots of memory hole width versus height in the NAND string 700na of FIG. 6B.

FIG. 7A depicts an example view of NAND strings in the block BLK0 which is consistent with FIGS. 4 and 6A.

FIG. 7B depicts an example top view of the block BLK0 of FIG. 7A, with respective NAND strings, bit lines and sense circuits.

FIG. 14C depicts example voltage signals in a program operation, consistent with FIG. 14A.

FIG. 14D depicts an example table showing program loops in which data states complete programming, a ΔPL between state(n) and state(n−1), and an indication of whether ΔPL exceeds a threshold (Th), consistent with FIG. 14B.

FIG. 14E depicts an example table showing program loops in which data states complete programming, a ΔPL between state(n) and state(n−2), and an indication of whether ΔPL exceeds a threshold, consistent with FIG. 14B.

FIG. 16D depicts an example table showing program loops in which data states complete programming, a ΔPL between state(n) and state(n−1), and an indication of whether ΔPL exceeds a threshold (Th).

FIG. 17A depicts a plot of a ΔPL threshold versus a Vth of state(n), consistent with FIGS. 14D, 14E and 16D.

FIG. 17B depicts a plot of a ΔPL threshold versus a height (h) of a selected word line in a program operation, consistent with FIGS. 6C and 6D.

FIG. 17C depicts a plot of ΔPW versus an amount by which the APL threshold is exceeded, consistent with FIGS. 13, 14C, 15 and 16C.

DETAILED DESCRIPTION

Figure 2:
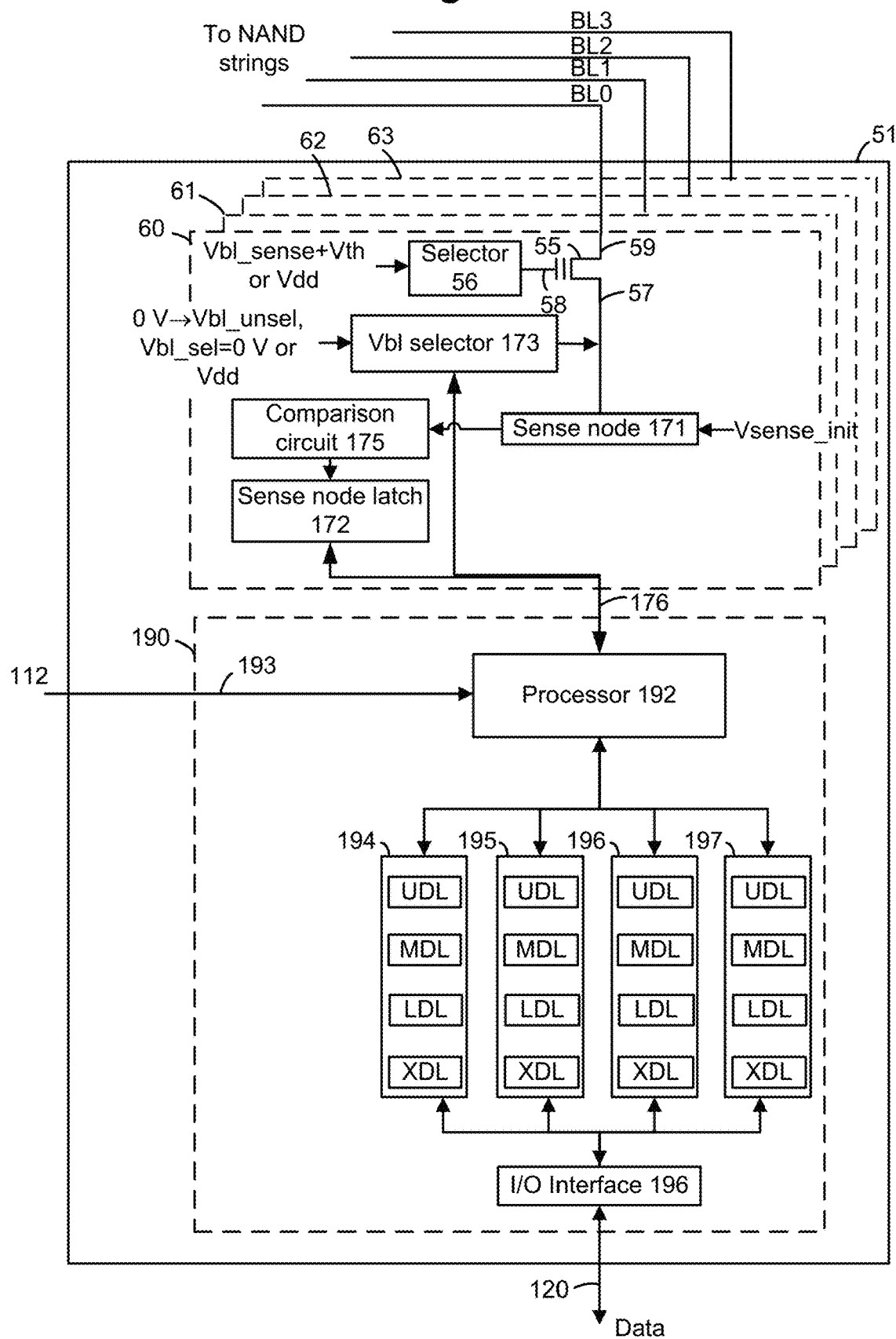
FIG. 2 is a block diagram depicting one embodiment of the sense block 51 of FIG. 1A.

Apparatuses and techniques are described for detecting and compensating for a set of memory cells having a slow program speed, based on a comparison between the number of program loops used to complete programming for different data states. The compensation can involve increasing a program pulse width while continuing to increment the program pulse magnitude.

In some memory devices, memory cells are joined to one another such as in NAND strings in a block or sub-block. Each NAND string comprises memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string is formed in a memory hole in the stack and may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

Data can be stored in the memory cells by programming them to different data states which are represented by different ranges of threshold voltages (Vths). Generally, one or more bits can be stored in each memory cell. For example, eight different data states can be used in a three-bit per cell approach. The data can be arranged in pages, where a page is a minimum unit of data which can be programmed or read. The data states can include an erased state and one or more programmed data states.

During programming, a series of program-verify loops (program loops) are performed for a selected word line. Each program-verify loop is performed by applying a program pulse followed by one or more verify voltages to a selected word line. During each program pulse, programming is enabled for memory cells which have not yet completed programming. For example, the programming of a memory cell in a NAND string can be enabled by setting the respective bit line voltage to 0 V. Also, during each program pulse, programming is inhibited for memory cells which have completed programming, or which are assigned to the erased state and therefore do not undergo programming. For example, the programming of a memory cell in a NAND string can be inhibited by setting the respective bit line voltage to 1-2 V.

During the applying of a verify voltage associated with a data state, the memory cells which are assigned to that data state and which have not previously completed programming are sensed in a verify test to determine whether their Vth exceeds the verify voltage. If the Vth exceeds the verify voltage, the memory cell has successfully completed programming. Typically, the program operation is successful if the programming of all the data states is completed within a maximum allowable number of program-verify loops.

After the programming is completed, a read operation can be performed to identify the data stored in the memory cells. A read operation can be performed by applying read voltages to the selected word line based on the page of data which is to be read. The read operation is successful if the data can be read without uncorrectable read errors.

However, defects in the memory device can interfere with its data-storage capabilities. For example, when forming memory holes in a stack, the width or critical dimension of the memory hole can vary from a specified profile, e.g., width versus height. This affects the program speed of the memory cells. In particular, a larger width results in a slower program speed due to a reduced electric field. Also, with a larger width, it is harder to fill in the word line metal such as Tungsten, especially for inner memory holes of the block. This can also reduce program speed.

Generally, it is difficult to etch the memory holes with a specified profile due to the high aspect ratio. Reactive ion etching may be used, but this results in plasma ion scattering which can cause locally widened regions in the memory hole. Memory cells connected to word lines at different heights in the memory hole will therefore experience different program speeds, resulting in a time penalty during programming. Moreover, this problem is expected to worsen in future memory devices as additional word lines are added to the stack. Other non-uniform process profiles include tilting of the memory holes, slits or other regions. Various process issues can result in slow programming memory cells. Generally, program speeds of the memory cells vary due to process variations of the block.

Techniques provided herein address the above and other issues. In one aspect, the program speed of a set of memory cells is detected and compensated during programming. A program loop (PL) number can be stored when programming is completed for memory cells of each assigned data state. The PL number of an nth state is then compared to the PL number of another state such as the n–$1^{st}$ state. If the difference between the PL numbers exceeds a threshold, the set of memory cells is considered to be slow programming and a compensation is triggered. The compensation can involve increasing the program pulse width in one or more remaining program pulses of the program operation. For example, the program pulse width can increase in each remaining program pulse, in every other remaining program pulse, and so forth.

In another approach, the compensation can be triggered (activated) and subsequently deactivated in the program operation. The compensation can be triggered based on a comparison of PL numbers, as described above. However, the comparison of PL numbers continues while the compensation is activated, and the compensation can be deactivated based on a subsequent comparison of PL numbers which does not exceed a threshold.

The comparison of PL numbers can be for adjacent data states or non-adjacent data states.

The threshold can be fixed or a function of the data states for which the PL numbers are compared.

The threshold can be a function of a height of the memory cells above a substrate.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, ... 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, including a program speed comparison table 112a (see examples in FIGS. 14D, 14E and 16D), an on-chip address decoder 114, and a power control circuit 115. The table 112a can include latches for storing data.

A storage region 113 may also be provided, e.g., for operational parameters and software/code. In one embodiment, the state machine is programmable by the software. In other embodiments, the state machine does not use software and is completely implemented in hardware (e.g., electrical circuits). The storage region 113 can be used to store optimum time periods which are determined in recovery read operations as described herein.

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, ..., 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. In some cases, uncorrectable read errors can occur which trigger recovery read operations as described herein. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively, or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, like the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein and to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 7A and 7B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four latches, e.g., comprising individual latches XDL, LDL, MDL, UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data. XDL is a data transfer latch which transfers data between the I/O interface 196 and the LDL, MDL and UDL latches.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
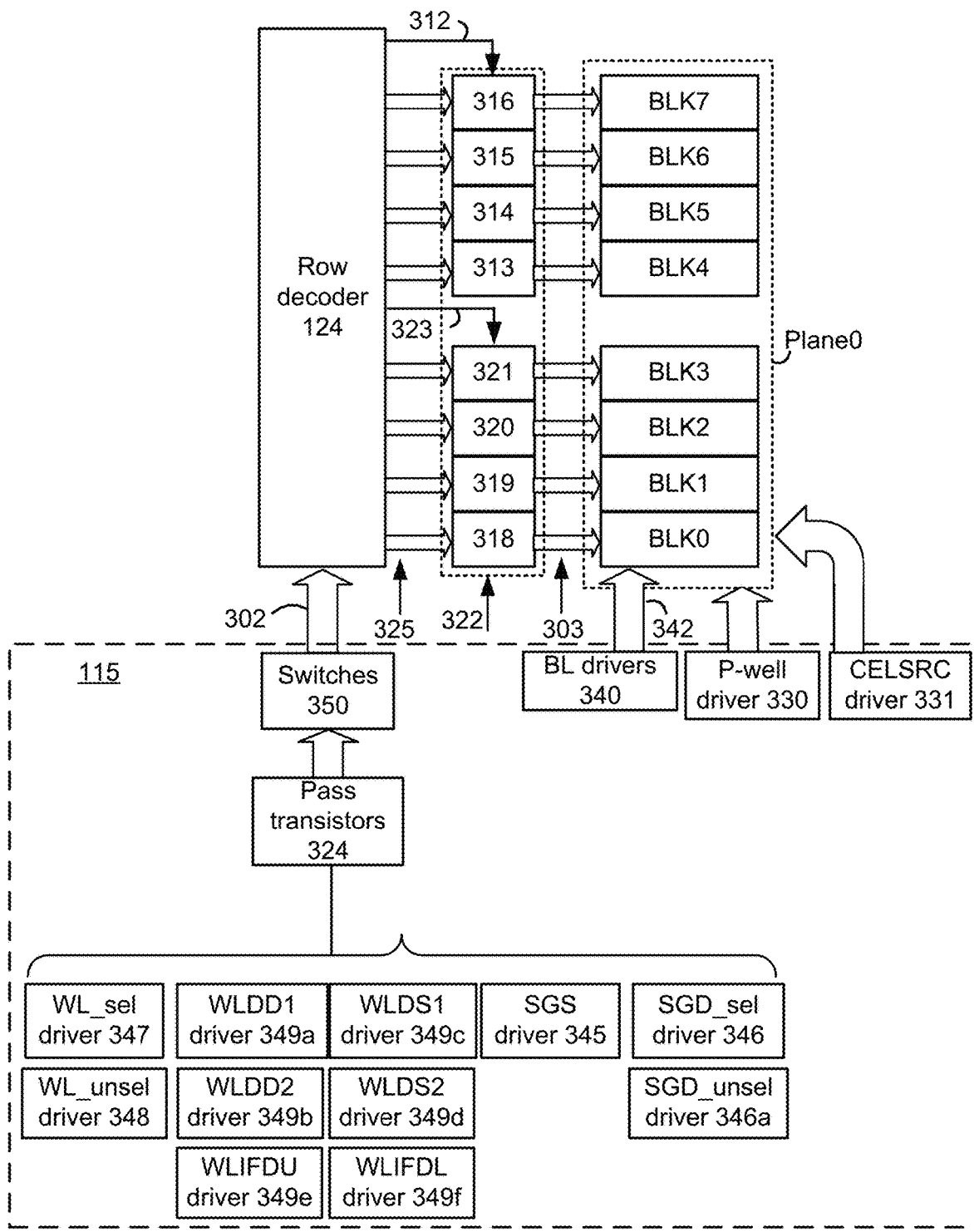
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of eight blocks, BLK0-BLK7, in a plane, Plane0, consistent with FIG. 4. Generally, the blocks can be in one or more planes. The row decoder 124 of FIG. 1A provides voltages to word lines and select gate control lines of each block via a set of pass transistors 322. In one approach, a separate row decoder is provided for each block. The row decoder can be provided one side of a block and provides a control signal to pass transistors which connect the blocks to the row decoder. Further, the blocks can be arranged in groups, where the pass transistors of each set of blocks in a group are controlled by a common control gate voltage. A first group includes BLK0-BLK3 and a second group includes BLK4-BLK7. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, in the first group, a control gate line 323 is connected to sets of pass transistors 318-321, which in turn are connected to control gate lines of BLK0-BLK3, respectively. In a second group, a control gate line 312 is connected to sets of pass transistors 313-316, which in turn are connected to control gate lines of BLK4-BLK7, respectively.

Typically, program or read operations are performed on one selected sub-block at a time in a block. An erase operation may be performed on a selected block or sub-block. The row decoder can connect global control lines 302 to post-switch, local control lines 303 via pre-switch control lines 325 and the set of pass transistors (switches) 322. The control lines represent conductive paths. Voltages can be provided on the global control lines from a one or more voltage drivers. Some of the voltage drivers may provide voltages to switches 350 which connect to the global control lines. Pass transistors 324 are controlled to pass voltages from the voltage drivers to the switches 350.

Voltage drivers can be provided that are connected to the pass transistors. For example, a selected data word line driver, WL_sel driver 347, provides a voltage signal on a data word line which is selected during a program or read operation.

The WL_unsel driver 348 provides a voltage signal on unselected data word lines. This voltage driver can be used to apply a voltage pulse to all word lines of one or more blocks in a word line voltage refresh operation, or to unselected word lines in a block in a read operation. In one approach, a single WL_unsel driver can apply the voltage pulse to word lines of one or more blocks at a given time on a chip by controlling the row decoders to either pass or block the voltage pulse.

Voltage drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612b in the p-well region 612, e.g., via the conductive path 682. See FIG. 6A. In one approach, the p-well region is common to a set of blocks. A set of bit lines is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 6A.

Bit line (BL) voltage drivers 340 include voltage sources which provide voltages to the bit lines. The bit line voltage for sensing can be 0.5 V, for example.

Figure 4:
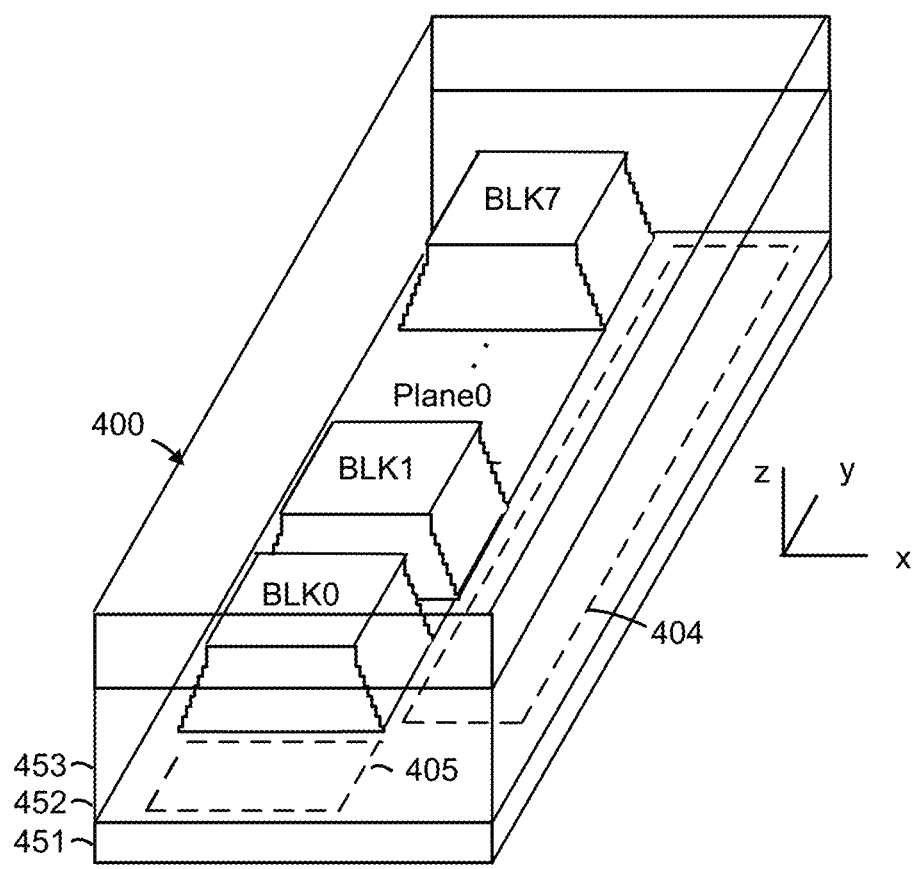
FIG. 4 is a perspective view of a memory device 400 comprising the blocks BLK0-BLK7 of FIG. 3 in an example 3D configuration.

FIG. 4 is a perspective view of a memory device 400 comprising the blocks BLK0-BLK7 of FIG. 3 in an example 3D configuration. The substrate 451 includes a plane, Plane0, on which the example blocks BLK0-BLK7 of memory cells (storage elements) are formed. Peripheral areas with circuitry for use by the blocks are also formed on the substrate. The peripheral area 404 extends along a long edge of the plane, while the peripheral area 405 extends along a short edge of the plane. The circuitry can include voltage drivers which can be connected to control gate layers, bit lines and source lines of the blocks. In one approach, control gate layers at a common height in the blocks are commonly driven. The substrate 451 can also carry circuitry under the blocks, and one or more lower metal layers which are patterned in conductive paths to carry signals of the circuitry. The blocks are formed in an intermediate region 452 of the memory device. In an upper region 453 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While eight blocks are depicted as an example, typically there are many more blocks extending in the x- and/or y-directions, in one or more planes.

In this example, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. When the blocks are in multiple planes, a separate set of bit lines may be used for each plane.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 5:
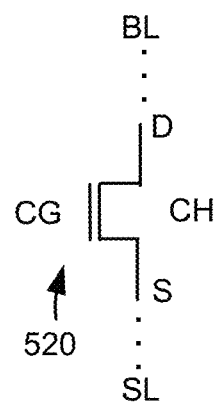
FIG. 5 depicts an example transistor 520 in the memory structure 126 of FIG. 1A.

FIG. 5 depicts an example transistor 520 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

Figure 6A:
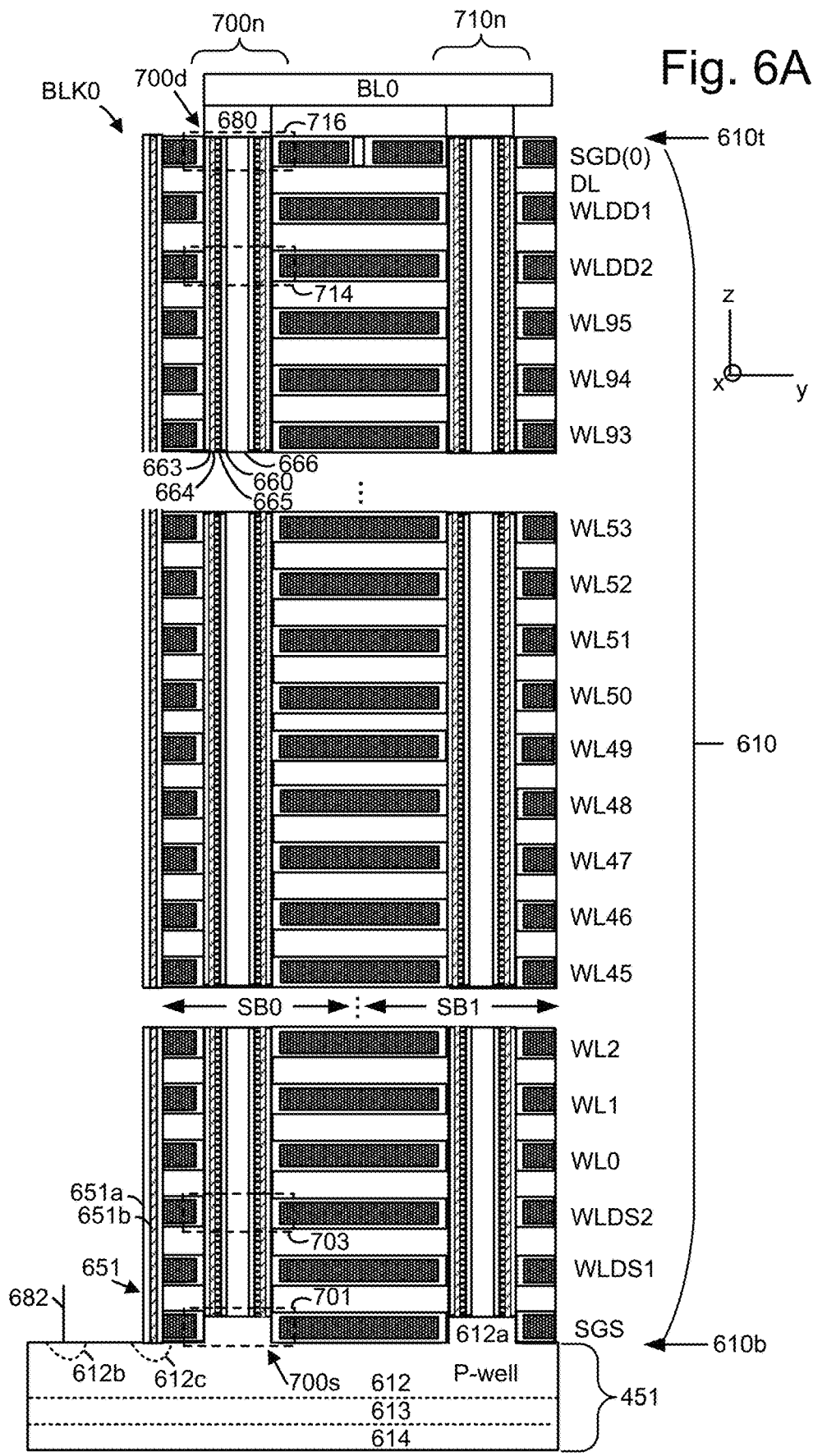
FIG. 6A depicts an example cross-sectional view of a portion of the block BLK0 of FIG. 4, including NAND strings 700n and 710n, in a single-tier stack.

FIG. 6A depicts an example cross-sectional view of a portion of the block BLK0 of FIG. 4, including NAND strings 700n and 710n, in a single-tier stack. In this example, the NAND strings 700n and 710n are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. More WL layers, or fewer WL layers, can also be used in this technology for variations. The data word lines are separated by dielectric layers. DL is an example dielectric layer.

The conductive layers connected to control gates of dummy memory cells are referred to as dummy word lines. Dummy memory cells may have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 451. In one approach, the substrate includes a p-well region 612 (see also FIG. 3) connected to the source ends of the NAND strings. The p-well region may comprise epitaxial regions 612a which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665.

Figure 6B:
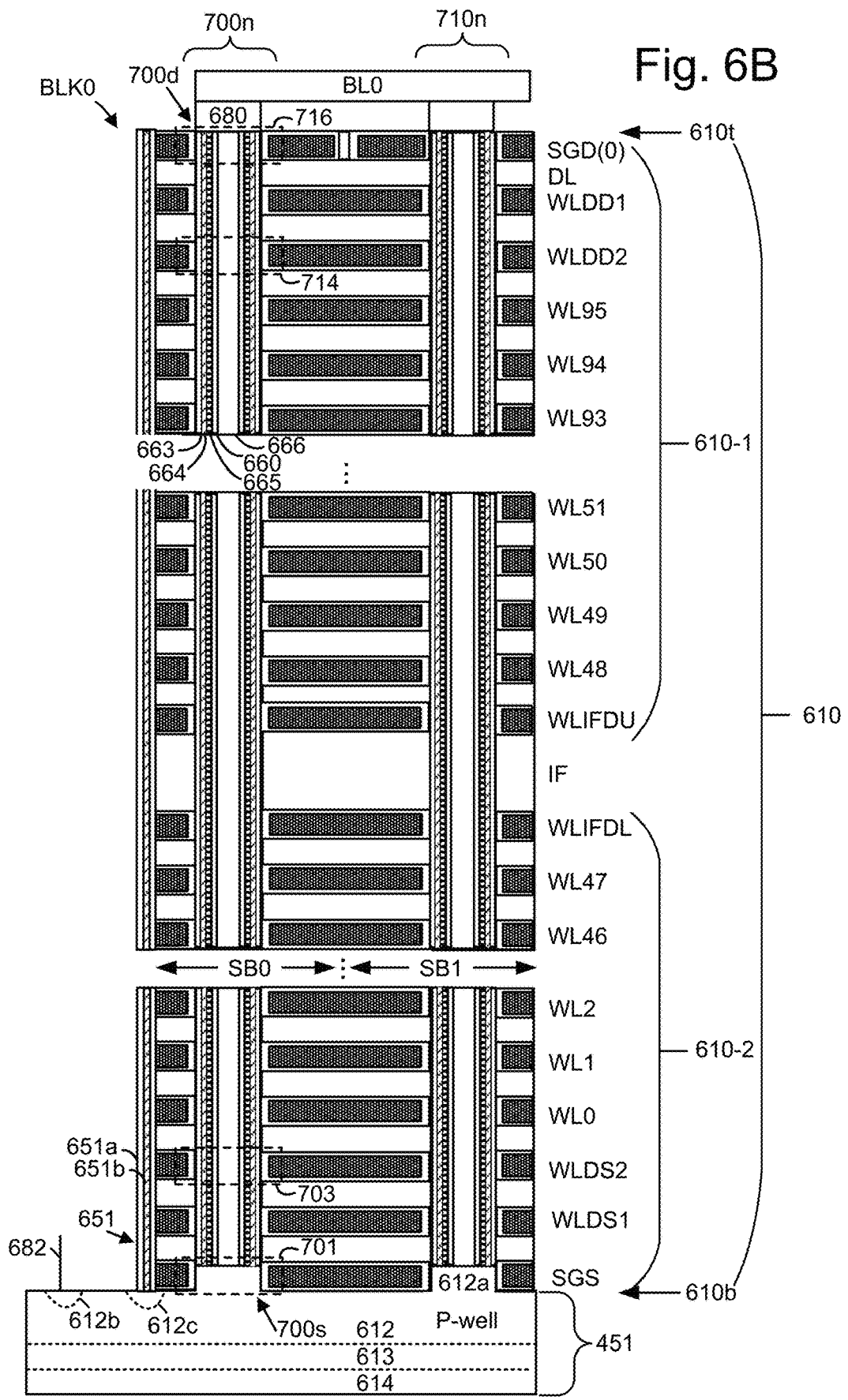
FIG. 6B depicts an example cross-sectional view of a portion of the block BLK0 of FIG. 4, including NAND strings 700n and 710n, in a two-tier stack comprising an upper tier 610-1 and a lower tier 610-2.

FIG. 6B depicts an example cross-sectional view of a portion of the block BLK0 of FIG. 4, including NAND strings 700n and 710n, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

FIG. 6C depicts example plots of memory hole width versus height in the NAND string 700n of FIG. 6A. The width of a memory hole can vary in the vertical direction due to variations in the etching process. The solid line depicts an example specified or ideal profile and the dashed line depicts an actual profile. In the ideal profile, the width is progressively greater higher in the memory hole. However, in the actual profile, there is an abnormally widened region 690 which can result in an abnormally slow program speed for the associated memory cells. A selected word line in a program operation, WLn, is at a height (h) above the substrate and will have a program speed which is a function of a width of the memory hole at that height. WLn is connected to a set of memory cell being programmed. The enlargement of the memory hole width is referred to as bowing. Other examples of abnormal profiles include striation (a vertical scratch on the sidewall), distortion and twisting. The abnormally widened region 690 can encompass a range of adjacent word lines. Moreover, one or more of these abnormally widened regions can be present. The techniques described herein can compensate for an abnormally widened regions, if present, without having to know the location or extent of the region.

FIG. 6D depicts example plots of memory hole width versus height in the NAND string 700na of FIG. 6B. The memory hole profile for each tier is similar to the profile depicted in FIG. 6C. The solid line depicts an example specified or ideal profile and the dashed line depicts an actual profile. In the ideal profile for each tier, the width is progressively greater higher in the memory hole. However, in the actual profile, there are abnormally widened regions 692 and 693 in the BT and TT, respectively.

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of BLK0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD (2) and SGD(3), respectively, in one approach.

FIG. 7B depicts an example top view of the block BLK0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

Figure 8:
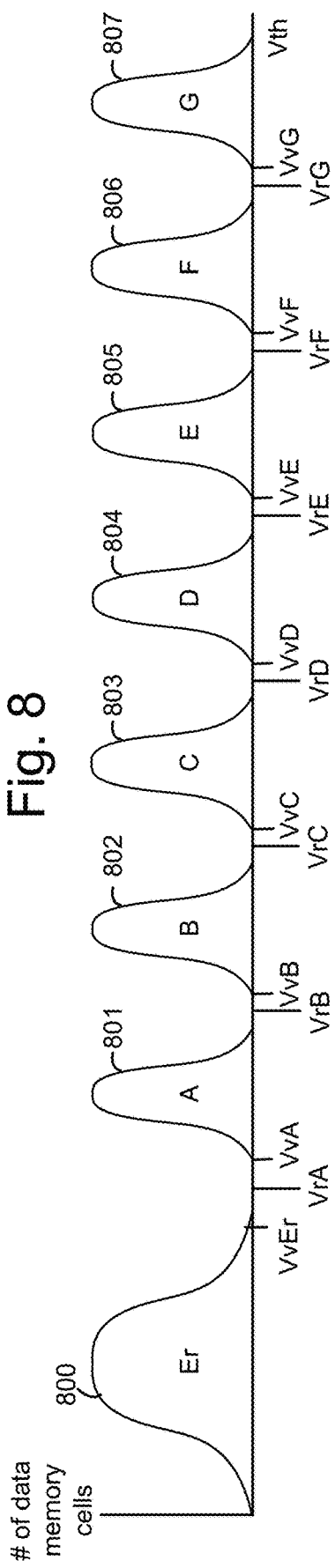
FIG. 8 depicts threshold voltage (Vth) distributions for data memory cells in an eight-state memory device.

FIG. 8 depicts threshold voltage (Vth) distributions for data memory cells in an eight-state memory device. Eight data states, or three bits per cell, are depicted as an example. The techniques herein can apply generally to modes with multiple bits per cell and are particularly suitable for 8, 16 or more data states. The vertical axis depicts a number of memory cells on a logarithmic scale and the horizontal axis depicts a threshold voltage on a linear scale. The Vth distributions can represent memory cells connected to a word line. After erasing the block, the Vth distribution 800 is obtained, representing the erased state. The erase operation is completed when the Vth of all, or nearly all, of the data memory cells is below an erase verify voltage, VvEr.

The memory cells are then subject to a programming operation. Each of the memory cells has an assigned data state. Some of the memory cells are assigned to the erased state and are not programmed. Most of the memory cells are programmed to higher states, such as A-F, in this example, as represented by Vth distributions 801-807, respectively. These memory cells are subject to verify tests using verify voltages of VvA-VvG. The data states which are reached by programming, e.g., the A-F states, are referred to as programmed data states. The memory cells which are assigned to a programmed data state complete programming when all, or nearly all, e.g., at least 95-99%, of the memory cells have a Vth greater than the verify voltage. A lockout condition is reached for a memory cell when its Vth is greater than the verify voltage, such that the memory cell passes its verify test.

The memory cells can later be read in a read operation using the A-G state read voltages, VrA-VrG, respectively. A read operation occurs for a page of data and involves one or more read voltages. In one approach, a lower page read involves VrD, a middle page read involves VrF, VrC and VrA, and an upper page read involves VrG, VrE and VrB. In another approach, a lower page read involves VrA and VrE, a middle page read involves VrB, VrD and VrF, and an upper page read involves VrC and VrG.

Figure 9:
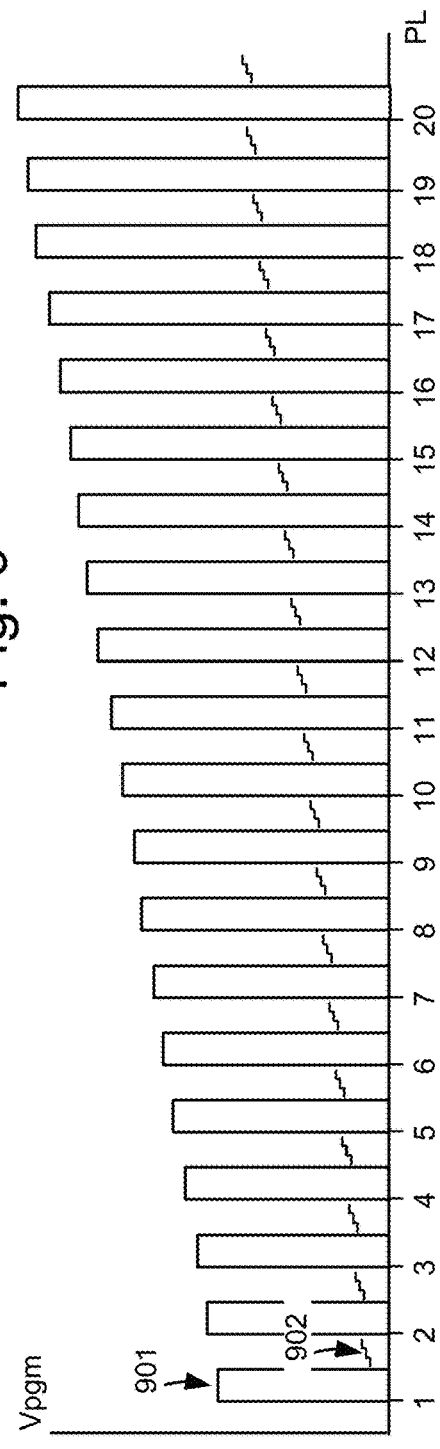
FIG. 9 depicts an example voltage signal 900 in a program operation, consistent with FIG. 8.

FIG. 9 depicts an example voltage signal 900 in a program operation, consistent with FIG. 8. In this example, the voltage signal includes 20 program-verify loops, PL1-PL20. Each loop includes a program pulse and verify voltages. For example, a program pulse plot 901 and verify voltages (plot 902) are provided in PL1. The verify voltages are depicted in a simplified form and can be provided for progressively higher data states as the programming proceeds, such as depicted in FIGS. 14B and 16B. The peak magnitudes of the program pulses may increase in consecutive program loops as depicted, in a technique referred to as incremental step pulse programming.

In one option, verify tests are not performed after the last program pulse. In this option, the results of a verify test in an nth PL are detected in the n+$1^{st}$ PL.

Figure 10:
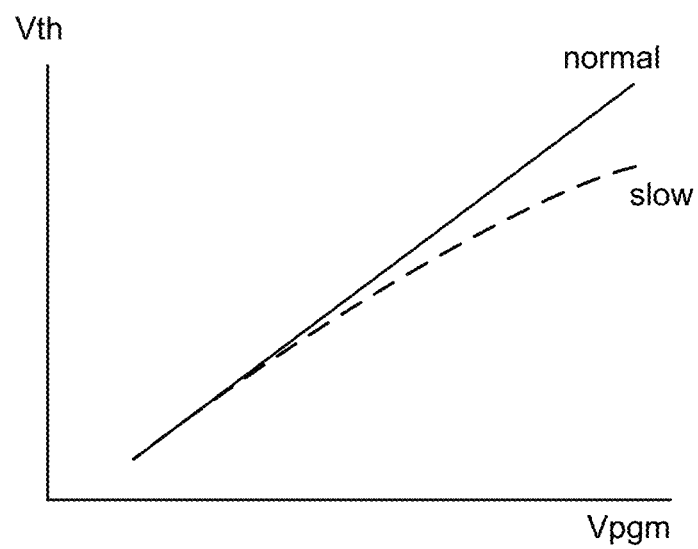
FIG. 10 depicts a plot of Vth versus Vpgm in a program operation for memory cells having normal and slow program speeds.

FIG. 10 depicts a plot of Vth versus Vpgm in a program operation for memory cells having normal and slow program speeds. The solid line denotes the case of memory cells with a normal program speed and the dashed line denotes the case of memory cells with a slow program speed, such as due to an abnormally wide memory hole. The plots represent a program slope, which is a change in Vth relative to a change in Vpgm. The program slope is linear for the case of a non-defective block with a normal program speed. For a defective block, the program slope decreases as Vpgm increases. This indicates slower programming especially when the memory cells reach the higher data states.

Figure 11A:
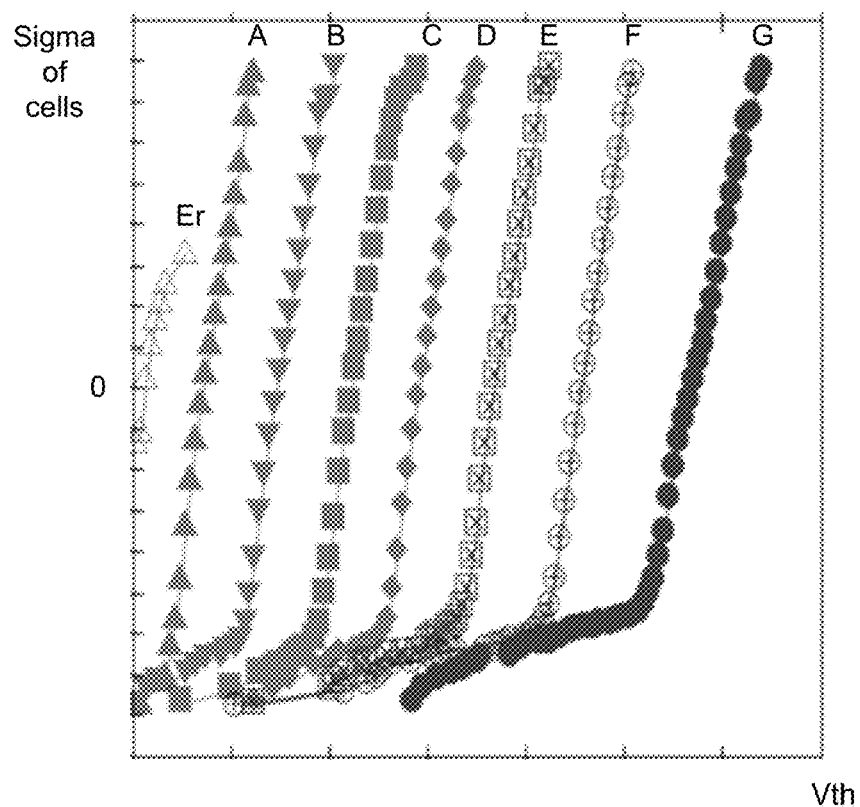
FIG. 11A depicts a plot of a sigma of cells versus Vth for a set of memory cells with a slow program speed, consistent with FIG. 10, and for different data states Er-G.

FIG. 11A depicts a plot of a sigma of cells versus Vth for a set of memory cells with a slow program speed, consistent with FIG. 10, and for different data states Er-G. The vertical axis depicts different levels of sigma, or standard deviation. The zero-sigma level represents the median of a Vth distribution, positive sigma levels represent the upper tail of the Vth distribution, and negative sigma levels represent the lower tail of the Vth distribution. Each plot represents the Vth of memory cells assigned to a data state Er-G, as indicated, after several program pulses are applied. The higher data states generally have a higher Vth, as expected. However, the Vth distribution is wider for the higher states due to a more extensive lower tail which is caused by slow programming memory cells. The Vth of the lower tail can eventually be raised to above the verify level, to achieve a narrow Vth width and complete the programming, but this requires additional program pulses and a corresponding time penalty.

Figure 11B:
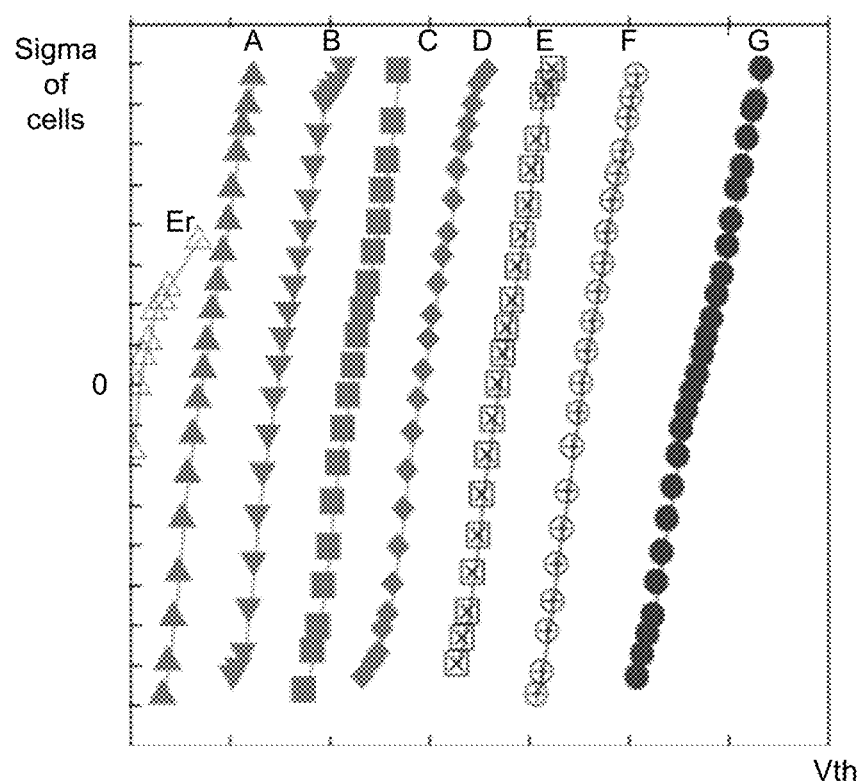
FIG. 11B depicts a plot of a sigma of cells versus Vth for a set of memory cells with a normal program speed, consistent with FIG. 10, and for different data states Er-G.

FIG. 11B depicts a plot of a sigma of cells versus Vth for a set of memory cells with a normal program speed, consistent with FIG. 10, and for different data states Er-G. As before, each plot represents the Vth of memory cells assigned to a data state Er-G, as indicated, after several program pulses are applied. In this case, the Vth distribution widths are relatively uniform for the different data states so that programming can be completed with fewer program pulses. The technique provided herein can achieve the uniform Vth distribution widths of FIG. 11B even when there is an abnormally wide memory hole which would otherwise result in the non-uniform Vth distribution widths of FIG. 11A.

Figure 12:
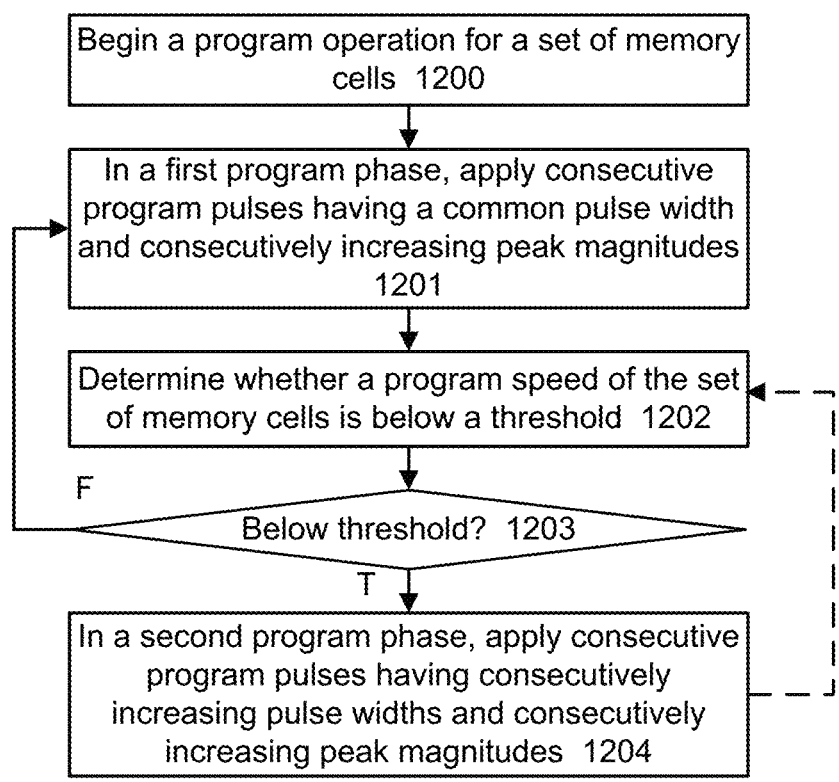
FIG. 12 depicts a flowchart of an example program operation which compensates for a set of memory cells with a slow program speed.

FIG. 12 depicts a flowchart of an example program operation which compensates for a set of memory cells with a slow program speed. Step 1200 begins a program operation for a set of memory cells, e.g., connected to a selected word line WLn at a height h above a substrate. Step 1201 includes, in a first program phase, applying consecutive program pulses having a common pulse width (PW) and consecutively increasing peak magnitudes (Vpgm). Step 1202 includes determining whether a program speed of the set of memory cells is below a threshold. This can involve determining whether a ΔPL is below a threshold for memory cells of two data states. For example, APL can represent a number of program loops used to complete programming for an nth data state minus a number of program loops used to complete programming for an n−$1^{st}$ data state, or another programmed data state which previously completed programming.

Generally, APL can represent a number of program loops used to transition between two program milestones in a program operation. As mentioned, the milestones can be the completion of programming for memory cells assigned to two respective data states. In this case, the two data states can be adjacent, such as states C and D, or non-adjacent, such as states C and E. Comparing the PL for completion of programming of two data states is useful because it identifies slow programming cells which increase the number of program loops needed to complete programming to a data state. Also, there is no need for extra verify tests since these verify tests are normally performed during programming.

In another option, APL can be based on a PL in which a data state first passes a verify test, such as when this PL is adaptively set during programming rather than fixed. This PL can be compared to the PL in which another data state first passes a verify test, or to the PL in which another data state completes programming. In another option, APL is based on one data state, such as the difference between the PL at which the verify test is first performed for the data state and the PL at which the data state completes programming.

A decision step 1203 determines whether the program speed is below the threshold. If the decision step is true, step 1204 includes, in a second program phase, applying consecutive program pulses having consecutively increasing pulse widths and consecutively increasing peak magnitudes. In one approach, the consecutively increasing peak magnitudes at steps 1201 and 1204 can increase according to a common step size. Increasing the pulse width while maintaining the common step size helps to increase the program speed without applying an excessively large Vpgm which can cause program disturb or over-stress the memory cells. Step 1204 can optionally involve applying one program pulse having an increased pulse width and an increased peak magnitude relative to a most recently applied program pulse.

In a first mode, once triggered, the consecutively increasing pulse widths and consecutively increasing peak magnitudes are used in the remaining program loops of the program operation, in the second program phase. This mode provides a simpler implementation and relies on the theory that memory cells which are slow to transition between some states are likely to be slow to transition between other, higher states. As a result, it is appropriate to maintain the countermeasure of consecutively increasing the pulse widths.

In a second mode, represented by the dashed line from step 1204 to the decision step 1202, the determination of whether the program speed of the set of memory cells is below a threshold is repeated in each program loop after triggering the consecutively increasing pulse widths and consecutively increasing peak magnitudes. The decision step 1203, if false, can trigger step 1201 which discontinues the consecutively increasing pulse widths and instead returns to program pulses with a fixed pulse width. A second pass through step 1201 would be a third program phase, a second pass through step 1204 would be a fourth program phase, and so forth. The fixed pulse width can be the last pulse width used in the consecutively increasing pulse widths of step 1204. This approach relies on the theory that memory cells which are slow to transition between some states will not necessarily be slow to transition between other, higher states, once the countermeasure of consecutively increasing pulse widths is implemented. As a result, it is appropriate to repeatedly evaluate the need for the countermeasure of consecutively increasing the pulse widths and to discontinue the countermeasure if the program speed has increased sufficiently.

In the memory chip, a device trim parameter, F_adaptive_PW, can be defined to enable the adaptive program pulse width algorithm. Also, this parameter can be used to choose mode I or mode II as following.
1. F_adaptive_PW value is 00: adaptive program pulse width mode is disabled.
2. F_adaptive_PW value is 01: adaptive program pulse width mode I is enabled.
3. F_adaptive_PW value is 10: adaptive program pulse width mode II is enabled.

Meanwhile, a device trim parameter, F_Dpw, can be used to define the program pulse width increment step value.

Figure 13:
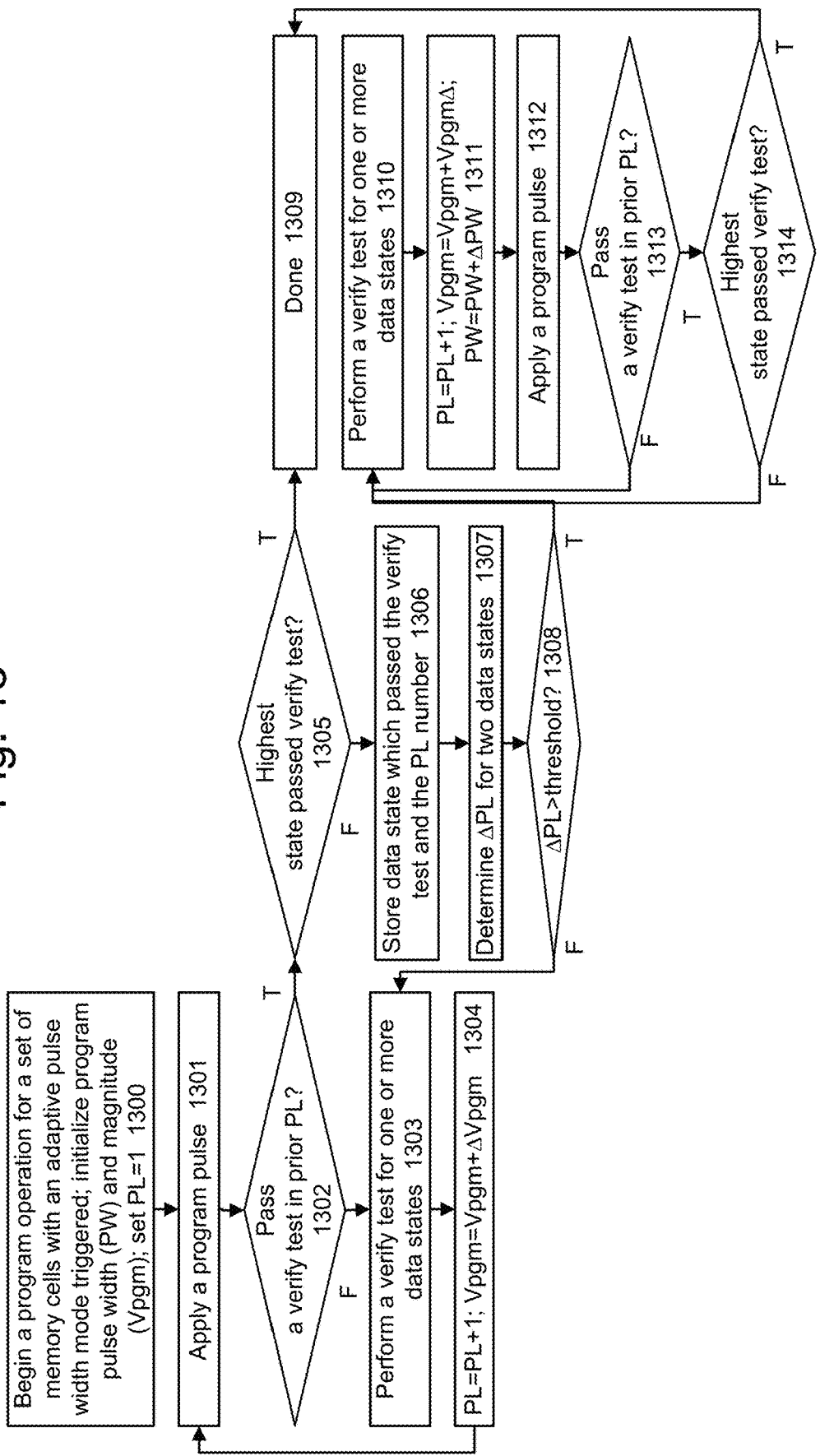
FIG. 13 depicts a flowchart of an example implementation of the program operation of FIG. 11, where the compensation for a slow program speed is triggered once in the program operation and remains activated until the completion of the program operation.

FIG. 13 depicts a flowchart of an example implementation of the program operation of FIG. 11, where the compensation for a slow program speed is triggered once in the program operation and remains activated until the completion of the program operation. This example is consistent with the first mode of FIG. 11. Step 1300 begins a program operation for a set of memory cells with an adaptive pulse width mode triggered. The step also initializes a program pulse width (PW) and magnitude (Vpgm) and sets a program loop counter PL=1. Step 1301 includes applying a program pulse to the set of memory cells such as via a selected word line.

A decision step 1302 determines whether the memory cells passed a verify test in a prior PL. In this example, the determination of whether a verify test performed in a given PL is passed is made in the next program loop. This approach saves time since a bit scan can be performed of the sense circuit latches to determine the verify result as a background operation. In another approach, the determination of whether a verify test performed in a given PL is passed is made in the same program loop. A verify test for a data state is passed when all, or nearly all, of the memory cells assigned to the data state have a Vth greater than a verify voltage of the data state. If the decision step 1302 is false (F), step 1303 performs a verify test for one or more data states. Step 1304 then increments PL by 1 and Vpgm by the step size ΔVpgm. Step 1301 is then reached to apply a next program pulse in a next program loop.

If the decision step 1302 is true (T), a decision step 1305 determines whether the highest data state has passed the verify test. For example, this is the G state in an eight-state device. If the decision step 1305 is true, the program operation is done at step 1309. If the decision step 1305 is false, step 1306 stores an identity of the data state which passed the verify test and the corresponding PL number. For example, see the tables of FIGS. 14D and 14E. Step 1307 determines ΔPL for two data states, e.g., the data state which passed the verify test at step 1306 and a lower data state which passed a verify test in an earlier program loop. For example, the data state which passed the verify test at step 1306 can be referred to as state(n) and a lower data state which passed a verify test in an earlier program loop can be referred to as state(n−1), state(n−2) or other lower state. APL represents the number of program loops used by the memory cells to transition between the two data states. ΔPL also represents a program speed.

A decision step 1308 determines whether ΔPL>threshold, where "threshold" is a specified number of program loops. If the decision step is false, the transition between the two states is not abnormally slow, and steps 1303 and 1304 follow. The program pulse width continues at the initial level. However, if the decision step 1308 is true, steps 1310-1314 follow. Step 1310 performs a verify test for one or more data states, the same as step 1303. Step 1311 then increments PL by 1 and Vpgm by ΔVpgm, the same as step 1304. Additionally, step 1311 increments the program pulse width PW by ΔPW, different than step 1304. Step 1312 is then reached to apply a next program pulse in a next program loop.

A decision step 1313 determines whether the memory cells passed a verify test in a prior PL. If the decision step 1313 is false, steps 1310-1312 are repeated. If the decision step 1313 is true, a decision step 1314 determines whether the highest data state has passed the verify test. If the decision step 1314 is true, then the program operation is done at step 1309. If the decision step 1314 is false, steps 1310-1312 are repeated. In this example, once triggered, the incrementing of the program pulse width continues until the programming is completed and there is no further determination of ΔPL or comparing ΔPL to a threshold.

Figure 14A:
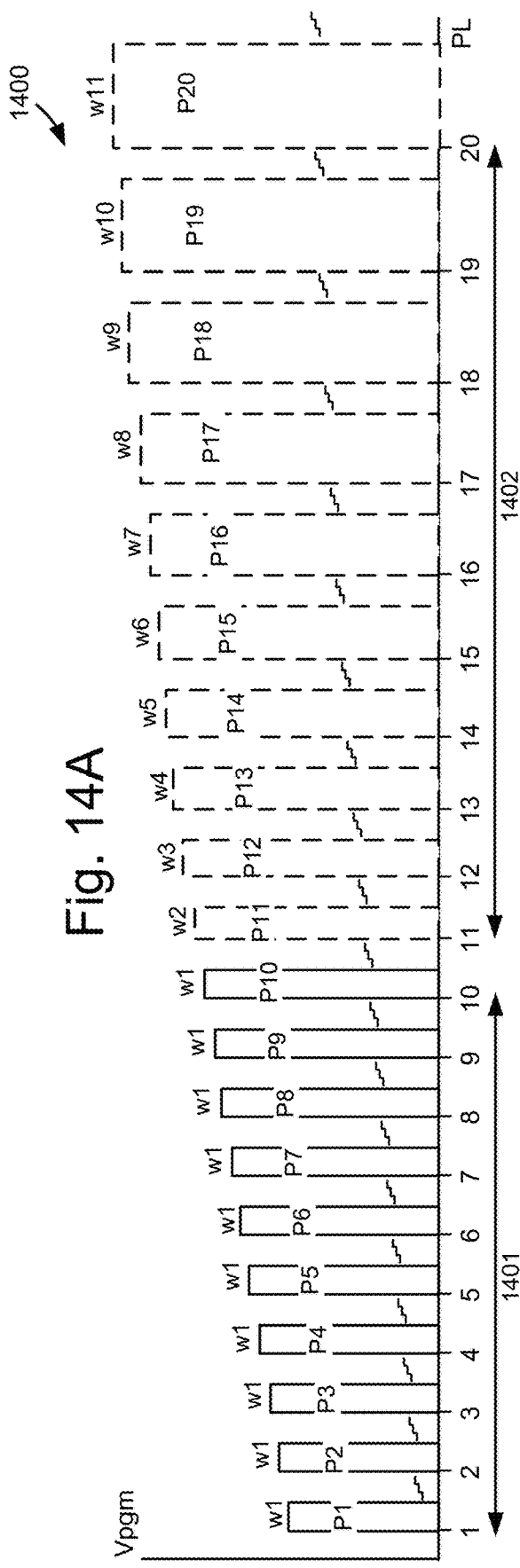
FIG. 14A depicts an example voltage signal 1400 in a program operation, consistent with FIG. 13.
Figure 14B:
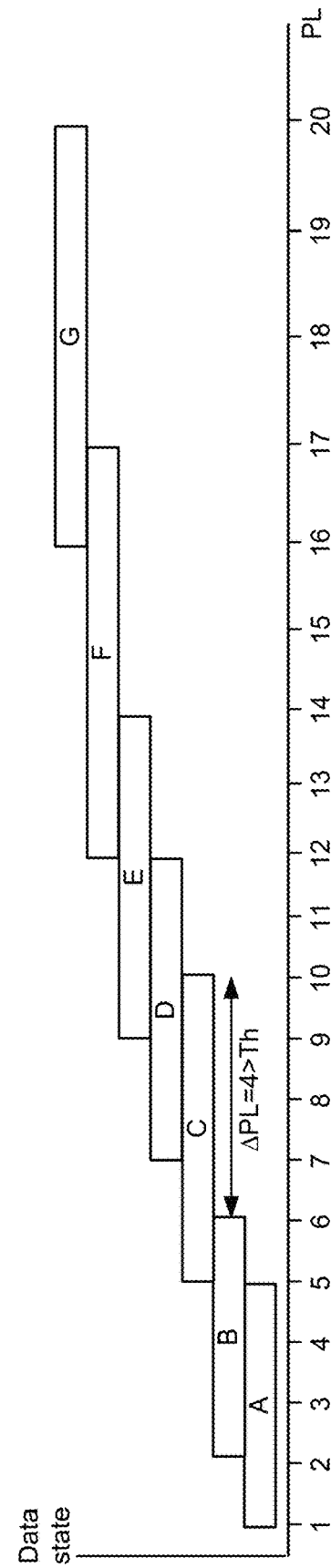
FIG. 14B depicts a plot of a correspondence between program loop number and data states which are verified, consistent with FIG. 14A.

FIG. 14A depicts an example voltage signal 1400 in a program operation, consistent with FIG. 13. The voltage signal includes 20 program-verify loops, PL1-PL20. Each loop includes a program pulse and verify voltages. The program pulses P1-P20 have respective pulse widths or durations. The pulse width can be the time in which the program pulse is at its peak magnitude, for example. In some cases, a program pulse steps up to an initial level such as Vpass and then to its peak magnitude, Vpgm. Or, the pulse width can include the time in which the program pulse steps up to, and is maintained at, the initial level.

In this example, the program pulses P1-P10 have a common pulse width, w1. These are consecutive program pulses, that is, program pulses which are applied one after another and not interrupted by other program pulses. The peak magnitude of the program pulses P1-P10 is Vpgm1-Vpgm10, respectively, such that P1-P10 have consecutively increasing peak magnitudes. In one approach, the increase is by a common step size ΔVpgm for each of the program pulses P2-P20 after the initial program pulse P1.

Starting with P11, the pulse width is increased consecutively for the consecutive program pulses P11-P20 to w2-w11, respectively. In one approach, the increase is by a common pulse width increment ΔPW. For example, w2−w1=ΔPW, w3−w2=ΔPW and so forth. The increase in the pulse width is triggered by ΔPL exceeding a threshold for the B and C states, as depicted in FIG. 14B.

The arrow 1401 represents a first program phase which applies consecutive program pulses having a first common pulse width (w1) and consecutively increasing peak magnitudes (Vpgm1-Vpgm10) to the set of memory cells. The arrow 1402 represents a second program phase which applies consecutive program pulses having consecutively increasing pulse widths (w2-w11) and consecutively increasing peak magnitudes (Vpgm11-Vpgm20) to the set of memory cells.

FIG. 14B depicts a plot of a correspondence between program loop number and data states which are verified, consistent with FIG. 14A. The verify tests can be provided for progressively higher data states as the programming proceeds. This approach saves time by avoiding verify tests for data states which are not likely to complete programming in a current program loop. The horizontal bars indicate when the verify tests are performed for each state. In one approach, a data state begins its verify test in a predetermined program loop and finishes its verify test a number of program loops later which is not fixed. In another, adaptive, approach, a data state can begin its verify test at a program loop which is based on another data state, such as a specified number of program loops after the another data state begins or ends its verify tests. For example, the verify tests for the D state can begin two program loops after the A state completes programming.

In this example, the A state cells complete programming in PL5 and are subject to a respective verify test in PL1-5, the B state cells complete programming in PL6 and are subject to the respective verify test in PL2-6, the C state cells complete programming in PL10 and are subject to the respective verify test in PL5-10, the D state cells complete programming in PL12 and are subject to the respective verify test in PL7-12, the E state cells complete programming in PL14 and are subject to the respective verify test in PL9-14, the F state cells complete programming in PL17 and are subject to the respective verify test in PL12-17, and the G state cells complete programming in PL20 and are subject to the respective verify test in PL16-20.

Also in this example, the ΔPL for the A and B states does not exceed a threshold. However, the ΔPL for the B and C states exceeds a threshold, Th, in a comparison made in PL10. This triggers the incrementing of the program pulse width in the next program loop, PL11.

FIG. 14C depicts example voltage signals in a program operation, consistent with FIG. 14A. Voltage signals 1410-1417 are provided for SGD_sel, the SGD transistors of a selected sub-block being programmed, WL_sel, the selected word line connected to a set of memory cells being programmed, WL_unsel, the word lines connected to sets of memory cells not being programmed, SGS, the SGS transistors of the block being programmed, Vbl_sel, the bit line voltage for bit lines of selected (programmed) NAND strings, Vbl_unsel, the bit line voltage for bit lines of unselected (inhibited) NAND strings, SGD_unsel, the SGD transistors of unselected (inhibited) sub-blocks, and CELSRC, the source line voltage for the block being programmed.

PL(1) is a first program loop or program-verify iteration, PL(n) is an nth program loop or program-verify iteration, where n>1, and PL(N) is an Nth and final program loop, where 1<n<N. In PL(1) and PL(n), Vsgd such as 3 V is applied to provide the SGD_sel transistors in a conductive state while a program pulse is applied to WL_sel. A read pass voltage, Vread, such as 8 V is applied to provide the unselected memory cells in a conductive state while a verify voltage Vcgry is applied to WL_sel. In PL(N), Vsgd is applied to the SGD_sel transistors.

In PL(1), a program voltage with a magnitude of Vpgm(1) and a pulse width PW, is applied to WL_sel to bias the associated memory cells for programming. Subsequently, a verify test involves applying a verify voltage, Vcgrv, to WL_sel while sensing the memory cells. One verify voltage is shown for simplicity but, in practice, one or more verify voltages can be applied in a program loop.

In PL(n), a program voltage with a magnitude of Vpgm(n) and a pulse width PW+ΔPW, is applied to WL_sel. This example assumes a ΔPL comparison which was made in the previous program loop exceeded a threshold, thus triggering an increase in the pulse width. Subsequently, a verify test applies Vcgrv.

The peak magnitude of the program voltage increases in each consecutive program loop after the first program loop.

In PL(N), a program voltage with a magnitude of Vpgm(N) and a pulse width PW+RN−n)+11*ΔPW, is applied to WL_sel, and the program operation is completed. For example, if n=11 and N=20, consistent with FIGS. 14A and 14B, PW+RN−n)+11*ΔPW=PW+[(20−11)+1]*ΔPW=PW+10*ΔPW.

In PL(1) and PL(n), during the program pulse on WL_sel, a program pass voltage Vpass, such as 8-9 V, is applied to WL_unsel to provide the associated memory cells in a conductive state and to boost the channel voltages of the unselected NAND strings. During the verify test on WL_sel, Vread is applied to WL_unsel. In PL(N), during the program pulse on WL_sel, Vpass is applied to WL_unsel.

Vread is applied to the SGS transistors, and a sense voltage, Vsense, is applied to Vbl_sel, during the verify tests of PL(1) and PL(n).

A program inhibit voltage, Vddsa, e.g., 1.5-2 V, is applied to Vbl_unsel during the program pulses of PL(1), PL(n) and PL(N).

0 V is applied to SGD_unsel to help bias these transistors in a non-conductive state, and 0 V is applied to SGS.

FIG. 14D depicts an example table showing program loops in which data states complete programming, a ΔPL between state(n) and state(n−1), and an indication of whether ΔPL exceeds a threshold (Th), consistent with FIG. 14B. This is an example of the table 112a of FIG. 1A. The table is an example of a data structure which can be used to store data for implementing the techniques discussed herein. These examples involve a memory device with eight data states and three bits per cell, although other options are possible.

The table can be updated by the state machine or other control circuit during a program operation. For example, when programming to one data state is completed for a set of memory cells, the number of program loops used to complete the programming is recorded. When programming to another data state is completed, the number of program loops used to complete the programming is recorded. A program loop delta is then determined between the two numbers to determine if the delta is greater than a threshold, indicating the cells are slow programming.

In the table, the first column denotes a data state to which the memory cells are programmed. The second column denotes the PL at which the data state completes programming, i.e., the memory cells assigned to the data state complete programming. The third column denotes ΔPL=PL(state(n))−PL(state(n−1)). This example determines the number of program loops used to transition between two adjacent data states. The fourth column denotes whether ΔPL exceeds a threshold (Th). In this example, Th=3 program loops for each comparison between data states.

Consistent with FIG. 14B, the A-F states complete programming at PL=5, 6, 10, 12, 14, 17 and 20, respectively. ΔPL is not determined for the A state because it is the lowest programmed state, so there is no lower programmed state to compare it to, or for the G state because it is the highest programmed state and the program operation is completed when the G state completes programming. ΔPL=1 and 4 for the B and C states, respectively, which are compared to the A and B states, respectively. When the B state completes programming, a determination is made that ΔPL=1 so the threshold is not exceeded. Subsequently, when the C state completes programming, a determination is made that ΔPL=4 so the threshold is exceeded. The increasing pulse width mode is then triggered and activated for the remainder of the program operation. The ΔPL values are not depicted for comparisons of other data states since they do not matter. The dashed lines "- -" denote "not applicable" or "doesn't matter."

FIG. 14E depicts an example table showing program loops in which data states complete programming, a ΔPL between state(n) and state(n−2), and an indication of whether ΔPL exceeds a threshold, consistent with FIG. 14B.

In the table, the first column denotes a data state to which the memory cells are programmed. The second column denotes the PL at which the data state completes programming. The third column denotes ΔPL=PL(state(n))−PL(state(n−2)). This example thus determines the number of program loops used to transition between two non-adjacent data states. The data states which are compared are separated by one other data state. This can provide a clearer indication of whether the memory cells are slow programming. The fourth column denotes whether ΔPL exceeds a threshold (Th). In this example, Th=5 program loops for each comparison between data states. The threshold is greater since the compared states are non-adjacent. If the compared states were separated by more than one other state, the threshold would be even greater.

As in FIG. 14D, the A-F states complete programming at PL=5, 6, 10, 12, 14, 17 and 20, respectively. ΔPL is not determined for the A and B states because there is no programmed state which is two states lower to compare it to, or for the G state. ΔPL=5 and 6 for the C and D states, respectively, which are compared to the A and B states, respectively. When the C state completes programming, a determination is made that ΔPL=5 so the threshold is not exceeded. Subsequently, when the D state completes programming, a determination is made that ΔPL=6 so the threshold is exceeded. The increasing pulse width mode is then triggered and activated for the remainder of the program operation.

Figure 15:
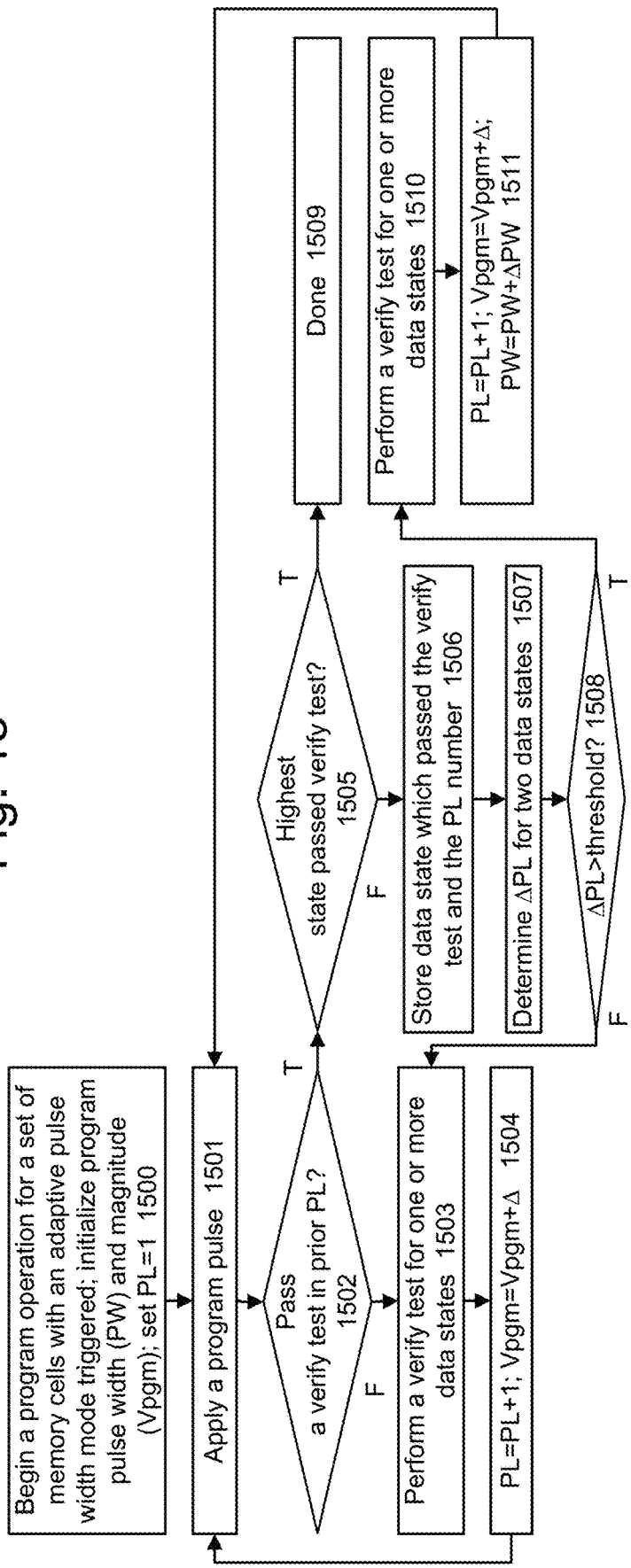
FIG. 15 depicts a flowchart of an example implementation of the program operation of FIG. 11, where the compensation for a slow program speed can be triggered and deactivated in the program operation.

FIG. 15 depicts a flowchart of an example implementation of the program operation of FIG. 11, where the compensation for a slow program speed can be triggered and deactivated in the program operation. This example is consistent with the second mode of FIG. 11. The triggering can occur one or more times, and the deactivating can occur one or more times.

Step 1500 begins a program operation for a set of memory cells with an adaptive pulse width mode triggered. The step also initializes a program pulse width (PW) and magnitude (Vpgm) and sets a program loop counter PL=1. Step 1501 includes applying a program pulse to the set of memory cells such as via a selected word line.

A decision step 1502 determines whether the memory cells passed a verify test in a prior PL. If the decision step 1502 is false, step 1503 performs a verify test for one or more data states. Step 1504 then increments PL by 1 and Vpgm by the step size ΔVpgm. Step 1501 is then reached to apply a next program pulse in a next program loop.

If the decision step 1502 is true, a decision step 1505 determines whether the highest data state has passed the verify test. If the decision step 1505 is true, then the program operation is done at step 1509. If the decision step 1505 is false, step 1506 stores an identity of the data state which passed the verify test and the corresponding PL number. For example, see the table of FIG. 16D. Step 1507 determines ΔPL for two data states, e.g., the data state which passed the verify test at step 1506 and a lower data state which passed a verify test in an earlier program loop.

A decision step 1508 determines whether ΔPL>threshold. If the decision step is false, the transition between the two states is not abnormally slow, and step 1503 and 1504 follow. The program pulse width continues at the initial level. However, if the decision step 1508 is true, steps 1510 and 1511 follow. Step 1510 performs a verify test for one or more data states, the same as step 1503. Step 1511 then increments PL by 1 and Vpgm by ΔVpgm, the same as step 1504. Additionally, step 1511 increments the program pulse width PW by ΔPW, different than step 1504. Step 1501 is then reached to apply a next program pulse in a next program loop.

The process continues such that the comparison of step 1508 is performed for subsequent program loops, after the first loop in which the increasing of the pulse width is triggered. If the comparison step 1508 continues to be true, the increasing of the pulse width also continues. However, if the comparison step 1508 is false, the increasing of the pulse width is discontinued, and the pulse width is fixed at its most recent value. Accordingly, there can be multiple transitions in a program operation between the increasing pulse width mode and the fixed pulse width mode.

Figure 16A:
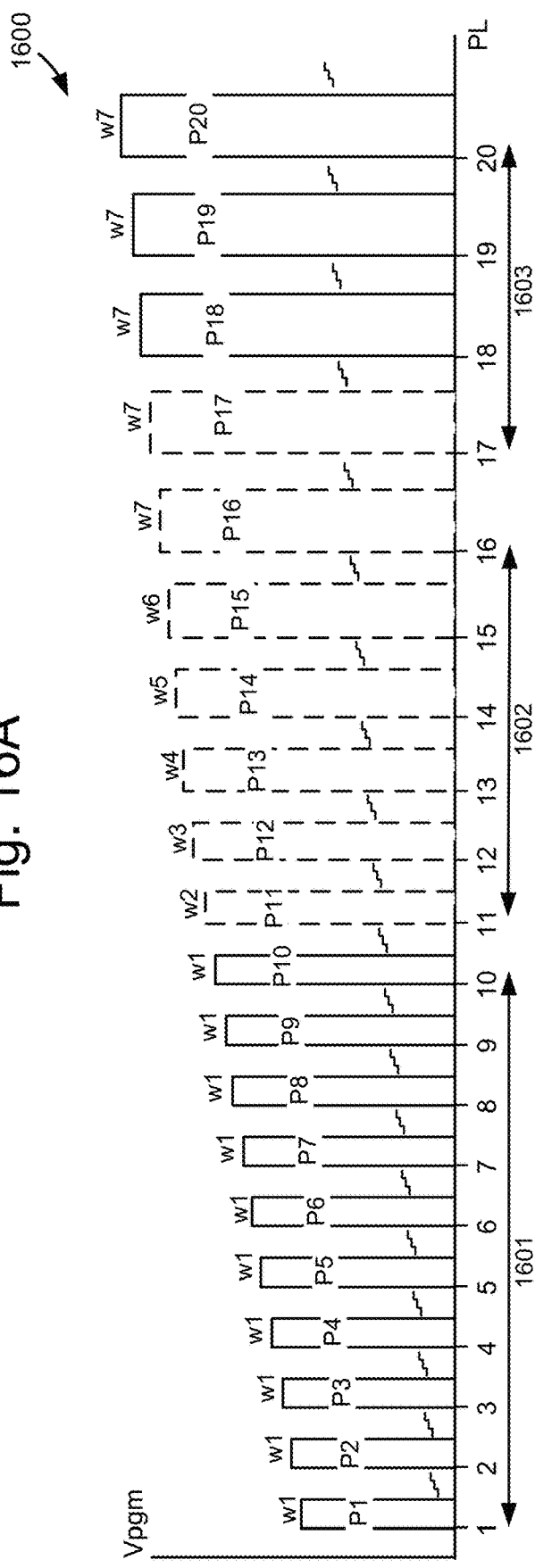
FIG. 16A depicts an example voltage signal 1600 in a program operation, consistent with FIG. 15.
Figure 16B:
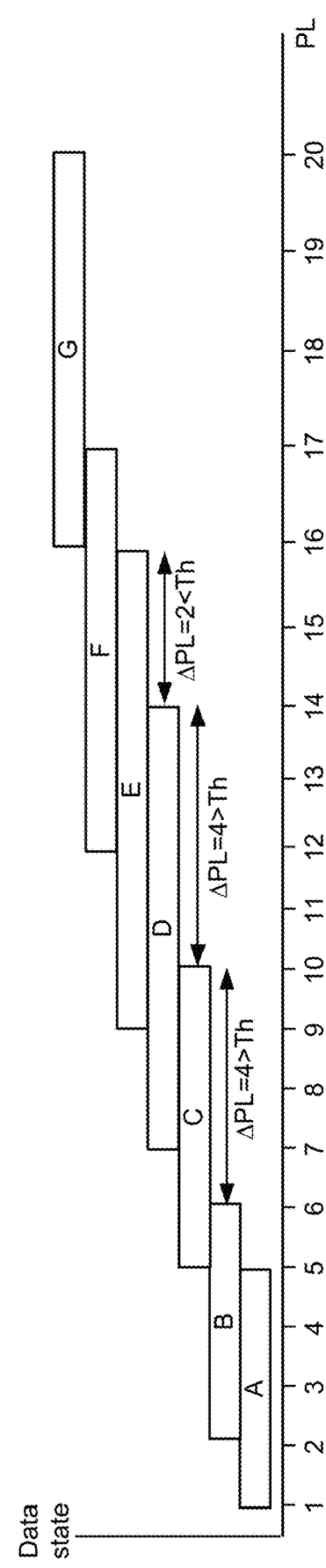
FIG. 16B depicts a plot of a correspondence between program loop number and data states which are verified, consistent with FIG. 16A.

FIG. 16A depicts an example voltage signal 1600 in a program operation, consistent with FIG. 15. The voltage signal includes 20 program-verify loops, PL1-PL20. Each loop includes a program pulse and verify voltages.

In this example, the consecutive program pulses P1-P10 have a common pulse width, w1, and consecutively increasing peak magnitudes.

Starting with P11, the pulse width is increased consecutively for the consecutive program pulses P11-P16 to w2-w7, respectively. The increase in the pulse width is triggered by ΔPL exceeding a threshold for the B and C states in PL10, as depicted in FIG. 16B. Subsequently, the increase in the pulse width is continued in response to ΔPL exceeding a threshold for the C and D states in PL14. Subsequently, at P17-P20, the increase in the pulse width is discontinued and the pulse width is fixed at w7, in response to ΔPL not exceeding a threshold for the D and E states in PL16. Thus, there is a transition from a fixed pulse width to an increasing pulse width at PL11 and transition from an increasing pulse width to a fixed pulse width at PL17. This approach avoids increasing the program speed too much by limiting the use of the increasing pulse widths.

The arrow 1601 represents a first program phase which applies consecutive program pulses having a first common pulse width (w1) and consecutively increasing peak magnitudes (Vpgm1-Vpgm10) to the set of memory cells. The arrow 1602 represents a second program phase which applies consecutive program pulses having consecutively increasing pulse widths (w2-w7) and consecutively increasing peak magnitudes (Vpgm11-Vpgm16) to the set of memory cells. The arrow 1603 represents a third program phase which applies consecutive program pulses having a second common pulse width (w7) and consecutively increasing peak magnitudes (Vpgm17-Vpgm20) to the set of memory cells.

FIG. 16B depicts a plot of a correspondence between program loop number and data states which are verified, consistent with FIG. 16A. The horizontal bars indicate when the verify tests are performed for each state.

In this example, the A state cells complete programming in PL5 and are subject to a respective verify test in PL1-5, the B state cells complete programming in PL6 and are subject to the respective verify test in PL2-6, the C state cells complete programming in PL10 and are subject to the respective verify test in PL5-10, the D state cells complete programming in PL14 and are subject to the respective verify test in PL7-14, the E state cells complete programming in PL16 and are subject to the respective verify test in PL9-16, the F state cells complete programming in PL17 and are subject to the respective verify test in PL12-17, and the G state cells complete programming in PL20 and are subject to the respective verify test in PL16-20.

In this example, the ΔPL for the A and B states at PL5 does not exceed a threshold, so that the program pulse width is fixed. However, the ΔPL for the B and C states at PL10 exceeds a threshold, so that the program pulse width starts to increase at PL11. The ΔPL for the C and D states at PL14 also exceeds a threshold, so that the program pulse width continues to increase at PL15. The ΔPL for the D and E states at PL16 does not exceed a threshold, so that the program pulse width is fixed at w7. The ΔPL for the E and F states at PL17 does not exceed a threshold, so that the program pulse width continues to be fixed for the remainder of the program operation.

Figure 16C:
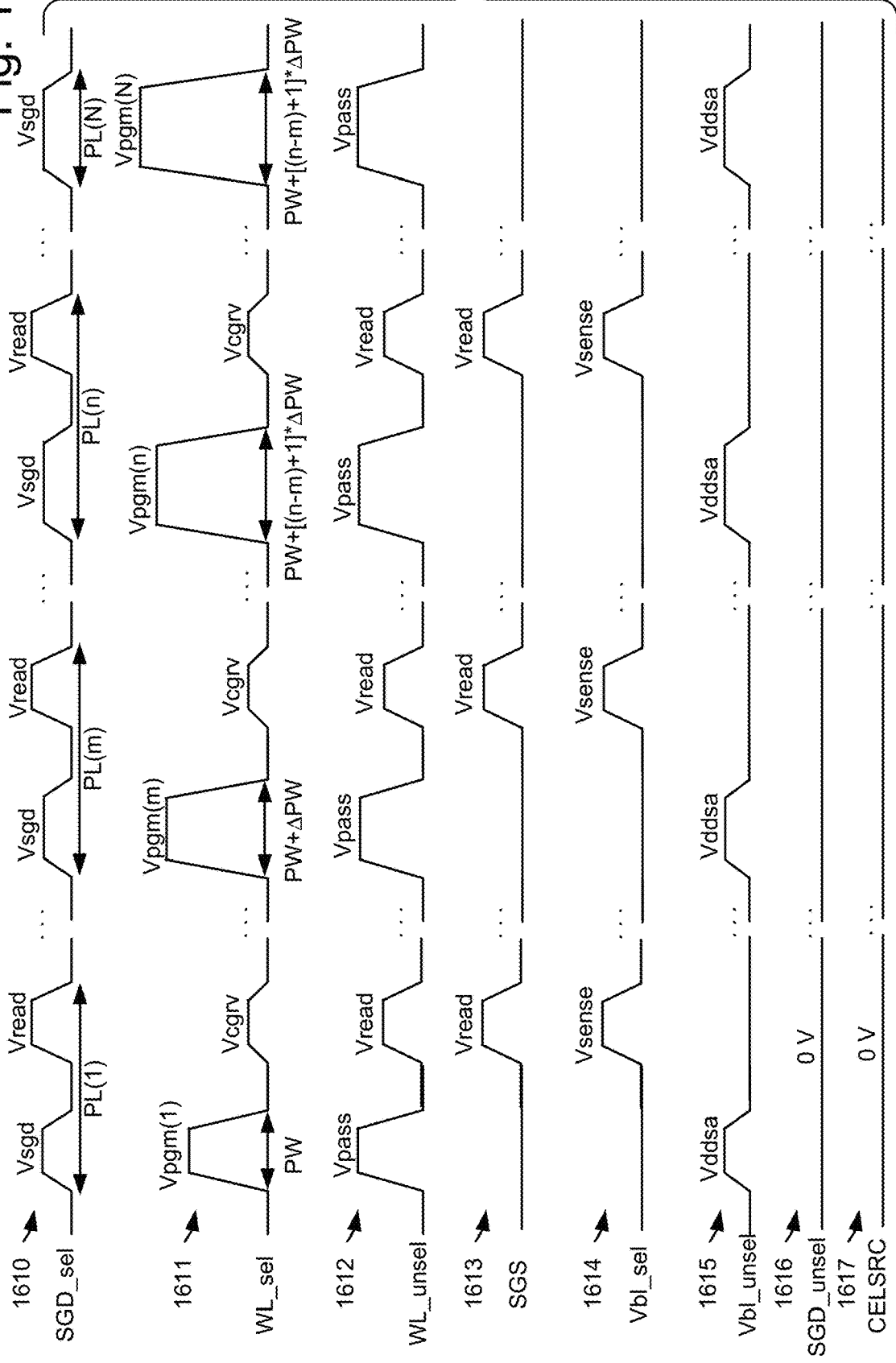
FIG. 16C depicts example voltage signals in a program operation, consistent with FIG. 16A.

FIG. 16C depicts example voltage signals in a program operation, consistent with FIG. 16A. Voltage signals 1610-1617 are provided for SGD_sel, WL_sel, WL_unsel, SGS, Vbl_sel, Vbl_unsel, SGD_unsel and CELSRC.

PL(1) is a first program loop or program-verify iteration, PL(m) is an mth program loop or program-verify iteration, PL(n) is an nth program loop or program-verify iteration, and PL(N) is an example Nth and final program loop, where 1<m<n<N. In PL(1), PL(m) and PL(n), Vsgd and Vread are applied as discussed in connection with FIG. 14C. In PL(N), Vsgd is applied.

In PL(1), a program voltage with a magnitude of Vpgm(1) and a pulse width PW, is applied to WL_sel.

In PL(m), a program voltage with a magnitude of Vpgm (m) and a pulse width PW+ΔPW, is applied to WL_sel.

The peak magnitude of the program voltages increases in each consecutive program loop after the first program loop.

In PL(n), a program voltage with a magnitude of Vpgm(n) and a pulse width PW+[(n-m)+1]*ΔPW is applied to WL_sel.

In PL(N), a program voltage with a magnitude of Vpgm (N) and a pulse width PW+[(n-m)+1]*ΔPW, the same as in PL(n), is applied to WL_sel.

The voltage signals for WL_unsel, SGS, Vbl_sel, Vbl_unsel, SGD_unsel and CELSRC are similar to the corresponding signals discussed in connection with FIG. 14C.

FIG. 16D depicts an example table showing program loops in which data states complete programming, a ΔPL between state(n) and state(n−1), and an indication of whether ΔPL exceeds a threshold (Th). This is another example of the table 112a of FIG. 1A.

In the table, the first column denotes a data state to which the memory cells are programmed. The second column denotes the PL at which the data state completes programming. The third column denotes ΔPL=PL(state(n))−PL(state (n−1)). The fourth column denotes whether ΔPL exceeds a threshold (Th). In this example, Th=3 program loops for each comparison between data states.

Consistent with FIG. 16B, the A-F states complete programming at PL=5, 6, 10, 14, 16, 17 and 20, respectively. When the B state completes programming, a determination is made that ΔPL=1 so the threshold is not exceeded. Subsequently, when the C state completes programming, a determination is made that ΔPL=4 so the threshold is exceeded, and the increasing pulse width mode is activated. Subsequently, when the D state completes programming, a determination is made that ΔPL=4 so the threshold is still exceeded, and the increasing pulse width mode continues. Subsequently, when the E state completes programming, a determination is made that ΔPL=2 so the threshold is not exceeded. The increasing pulse width mode is then discontinued, and the fixed pulse width mode is activated. Subsequently, when the F state completes programming, a determination is made that ΔPL=1 so the threshold is again not exceeded. The fixed pulse width mode is thus continued.

The ΔPL values are not depicted for comparisons of other data states since they do not matter. The dashed lines "- -" denote "not applicable" or "doesn't matter."

FIG. 17A depicts a plot of a ΔPL threshold versus a Vth of state(n), consistent with FIGS. 14D, 14E and 16D. When a ΔPL is compared to a threshold for two data states, such as state(n) and a lower state, state(n−1), the threshold can be an increasing function of the data states. For example, the threshold can be an increasing function of the verify voltage of the higher data state among the two compared data states. Generally, a wider range of ΔPL may be expected for higher states so that a higher threshold may be implemented to trigger the increasing pulse width mode for higher states.

In this example, the threshold is higher for transitions between higher data states than for transitions between lower data states, and the higher data states have higher verify voltages than the lower data states.

FIG. 17B depicts a plot of a ΔPL threshold versus a height (h) of a selected word line in a program operation, consistent with FIGS. 6C and 6D. As depicted in FIG. 6C, for example, the specified or ideal memory hole width is generally greater at increasing heights above the substrate. This widening is separate from the abnormally widened regions which may be caused by anomalies in the fabrication process. Slower programming is expected when the memory hole is wider due to a decreased electric field such that ΔPL for a set of word lines can be adjusted as an increasing function of the height of the set of word lines above the substrate. For similar reasons, ΔPW can also be an increasing function of the height.

FIG. 17C depicts a plot of ΔPW versus an amount by which the ΔPL threshold is exceeded, consistent with FIGS. 13, 14C, 15 and 16C. When the threshold is exceeded by a relatively larger number of program loops this indicates a relatively slower program speed. Accordingly, the countermeasure of increasing the pulse width by ΔPW can be made stronger by using a larger ΔPW when the threshold is exceeded by a relatively larger number of program loops. ΔPW can thus be an increasing function of an amount (number of program loops) by which the ΔPL threshold is exceeded. For example, if the threshold is exceeded by one PL, ΔPW=ΔPW1 and if the threshold is exceed by three PLs, ΔPW=ΔPW2, where ΔPW2>ΔPW1.

Other options are possible as well which can optimize ΔPW. For example, ΔPW can increase over successive or consecutive program loops rather than being fixed. For example, first increment PW by ΔPW1, then by ΔPW2, then by ΔPW3 and so forth, where ΔPW1<ΔPW2<ΔPW3.

In another option, ΔPW is set based on the number of ΔPL comparisons which exceed a threshold. This assumes that a larger ΔPW is warranted if the current ΔPW continues to result in the ΔPL comparisons exceeding a threshold. That is, the current ΔPW is not great enough to speed up the programming of the memory cells to the point where the ΔPL comparisons do not exceed a threshold. For example, if ΔPL exceeds a threshold for states B and C, set ΔPW1. If ΔPL further exceeds a threshold for states C and D, set ΔPW2>ΔPW1. If ΔPL further exceeds a threshold for states D and E, set ΔPW3>ΔPW2. If ΔPL further exceeds a threshold for states E and F, set ΔPW4>ΔPW3.

In another scenario, if ΔPL exceeds a threshold for states B and C, set ΔPW1. If ΔPL further exceeds a threshold for states C and D, set ΔPW2>ΔPW1. If ΔPL does not exceed a threshold for states D and E, maintain ΔPW2. If ΔPL further exceeds a threshold for states E and F, set ΔPW3. Thus, the ΔPW is incremented for each ΔPL which exceeds a threshold over the program operation. Other variations are possible as well.

Accordingly, in one implementation, an apparatus comprises: a control circuit configured to connect to a set of memory cells. The control circuit is configured to program the set of memory cells to a plurality of data states in a program operation, and to perform the program operation, the control circuit is configured to: in a first program phase, apply consecutive program pulses having a first common pulse width and consecutively increasing peak magnitudes to the set of memory cells; during the first program phase, determine when a number of program pulses used by the set of memory cells to transition between data states exceeds a threshold; and in response to the number of program pulses exceeding the threshold, begin a second program phase which applies consecutive program pulses having consecutively increasing pulse widths and consecutively increasing peak magnitudes to the set of memory cells.

In another implementation, a method comprises: in a first program phase, applying consecutive program pulses having a first common pulse width and consecutively increasing peak magnitudes to a set of memory cells; during the first program phase, determining a number of program pulses used to make a transition between data states and comparing the number to a respective threshold until a first transition is found in which the number exceeds a respective threshold; and in response to finding the first transition, starting a second program phase which applies consecutive program pulses having consecutively increasing pulse widths and consecutively increasing peak magnitudes to the set of memory cells.

In another implementation, an apparatus comprises: a control circuit configured to connect to a set of memory cells; and an interface connected to the control circuit. The control circuit is configured to issue commands via the interface to: in a first program phase, apply consecutive program pulses having a common pulse width; during the first program phase, determine that a program speed of the set of memory cells is below a threshold; and in response to the determining that the program speed of the set of memory cells is below the threshold, begin a second program phase in which additional programming is performed for the set of memory cells, the additional programming applies consecutive program pulses having consecutively increasing pulse widths.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells, the control circuit is configured to program the set of memory cells to a plurality of data states, the control circuit is configured to:
in a first program phase, apply consecutive program pulses having a first common pulse width and consecutively increasing peak magnitudes to the set of memory cells;
during the first program phase, determine a number of program pulses used by the set of memory cells to transition between data states;
determine when the number of program pulses exceeds a threshold;
in response to the number of program pulses exceeding the threshold, begin a second program phase which applies consecutive program pulses having consecutively increasing pulse widths and consecutively increasing peak magnitudes to the set of memory cells;

during the second program phase, determine that a number of program pulses used by the set of memory cells to transition between data states does not exceed a respective threshold; and in response to the number of program pulses not exceeding the respective threshold, begin a third program phase which applies consecutive program pulses having a second common pulse width and consecutively increasing peak magnitudes to the set of memory cells.

2. The apparatus of claim 1, wherein the second common pulse width is greater than the first common pulse width.

3. The apparatus of claim 2, wherein:
the second common pulse width is equal to a pulse width of a last program pulse of the second program phase.

4. The apparatus of claim 1, wherein:
to determine when the number exceeds the threshold, the control circuit is configured to determine respective numbers of program pulses used by the set of memory cells to make different transitions between data states and to compare the respective numbers to the threshold.

5. The apparatus of claim 1, wherein:
the threshold is higher for transitions between higher data states than for transitions between lower data states; and
the higher data states have higher verify voltages than the lower data states.

6. The apparatus of claim 1, wherein:
the control circuit is configured to apply the consecutive program pulses having consecutively increasing pulse widths and consecutively increasing peak magnitudes to the set of memory cells until programming of the set of memory cells is completed.

7. The apparatus of claim 1, wherein:
the data states are adjacent data states of the plurality of data states.

8. The apparatus of claim 1, wherein:
the data states are non-adjacent data states of the plurality of data states.

9. The apparatus of claim 1, wherein:
to determine the number of program pulses used by the set of memory cells to transition between the data states, the control circuit is configured to determine a difference between a number of program pulses use to complete programming to a first data state of the plurality of data states and a number of program pulses use to complete programming to a second data state of the plurality of data states.

10. The apparatus of claim 1, wherein:
each memory cell of the set of memory cells is in a respective NAND string of a set of NAND strings;
the set of NAND strings is formed in memory holes in a block and extend vertically from a substrate; and
program speeds of the memory cells vary due to process variations of the block.

11. The apparatus of claim 10, wherein:
the threshold varies as a function of a height of the set of memory cells above the substrate.

12. A method, comprising:
in a first program phase, applying consecutive program pulses having a first common pulse width and consecutively increasing peak magnitudes to a set of memory cells;
during the first program phase, determining a number of program pulses used to make a transition between data states and comparing the number to a respective threshold until a first transition is found in which the number exceeds a respective threshold;

in response to finding the first transition, starting a second program phase which applies consecutive program pulses having consecutively increasing pulse widths and consecutively increasing peak magnitudes to the set of memory cells;

during the second program phase, determining a number of program pulses used to make a transition between data states, comparing the number to a respective threshold, and determining that a second transition is not found in which the number exceeds the respective threshold; and in response to not finding the second transition, applying consecutive program pulses having a second common pulse width and consecutively increasing peak magnitudes to the set of memory cells in a third program phase.

13. The method of claim 12, wherein the second common pulse width is greater than the first common pulse width.

14. The method of claim 13, wherein:
the second common pulse width is equal to a pulse width of a last program pulse of the second program phase.

15. The method of claim 12, wherein:
the respective threshold differs for different transitions between data states.

16. An apparatus, comprising:
a control circuit configured to connect to a set of memory cells; and
an interface connected to the control circuit, the control circuit is configured to issue commands via the interface to:
in a first program phase, apply consecutive program pulses having a first common pulse width;
during the first program phase, determine that a first program speed of the set of memory cells is below a threshold;
in response to the determining that the first program speed is below the threshold, begin a second program phase in which additional programming is performed for the set of memory cells, the additional programming applies consecutive program pulses having consecutively increasing pulse widths;
during the second program phase, determine that a second program speed of the set of memory cells is below the threshold; and
in response to the determining that the second program speed is below the threshold, begin a third program phase in which additional programming is performed for the set of memory cells, the additional programming applies consecutive program pulses having a second common pulse width.

17. The apparatus of claim 16, wherein:
the control circuit is configured to issue a command via the interface to compare the program speed of the set of memory cells to the threshold after each program pulse of the consecutive program pulses of the first program phase.

18. The apparatus of claim 16, wherein:
the consecutive program pulses of the first program phase have consecutively increasing peak magnitudes; and
the consecutive program pulses of the second program phase have consecutively increasing peak magnitudes.

19. The apparatus of claim 16, wherein:
during the first program phase, to determine that the program first speed of the set of memory cells is below the threshold, the control circuit is configured to issue a command via the interface to determine that a number of program pulses used to transition between data states exceeds a respective threshold.

20. The apparatus of claim 16, wherein:
during the second program phase, the control circuit is configured to issue a command via the interface to apply the consecutive program pulses having the consecutively increasing pulse widths and consecutively increasing peak magnitudes to the set of memory cells until programming of the set of memory cells is completed.

* * * * *